US009508866B1

(12) United States Patent
Kishida et al.

(10) Patent No.: US 9,508,866 B1
(45) Date of Patent: Nov. 29, 2016

(54) THIN-FILM TRANSISTOR ELEMENT, METHOD FOR MANUFACTURING SAME, AND DISPLAY DEVICE

(71) Applicant: JOLED INC., Tokyo (JP)

(72) Inventors: Yuji Kishida, Tokyo (JP); Toshiaki Yoshitani, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/902,048

(22) PCT Filed: Jun. 20, 2014

(86) PCT No.: PCT/JP2014/003331
§ 371 (c)(1),
(2) Date: Dec. 30, 2015

(87) PCT Pub. No.: WO2015/001755
PCT Pub. Date: Jan. 8, 2015

(30) Foreign Application Priority Data

Jul. 5, 2013 (JP) .................. 2013-141838

(51) Int. Cl.
*H01L 27/14* (2006.01)
*H01L 29/786* (2006.01)
(Continued)

(52) U.S. Cl.
CPC ..... *H01L 29/78693* (2013.01); *H01L 27/1225* (2013.01); *H01L 29/41733* (2013.01);
(Continued)

(58) Field of Classification Search
CPC ............. H01L 29/78693; H01L 29/42356; H01L 29/78606; H01L 29/41733; H01L 29/78696; H01L 29/66969; H01L 27/1225
USPC ............................. 257/59, 72, 258
See application file for complete search history.

(56) References Cited

U.S. PATENT DOCUMENTS 5,443,922 A    8/1995   Nishizaki et al.
8,148,721 B2   4/2012   Hayashi et al.
(Continued)

FOREIGN PATENT DOCUMENTS

JP    04-137668    5/1992
JP    05-163488    6/1993
(Continued)

OTHER PUBLICATIONS

International Search Report (ISR) from International Searching Authority (Japan Patent Office) in International Pat. Appl. No. PCT/JP2014/003331, dated Sep. 16, 2014.

*Primary Examiner* — Tan N Tran
(74) *Attorney, Agent, or Firm* — Greenblum & Bernstein, P.L.C.

(57) ABSTRACT

A thin-film transistor includes: a gate electrode; a channel layer not adjacent to the gate electrode; a channel protection layer exposing portion of the channel layer; a source electrode contacting the channel layer at portion of an exposed portion of the channel layer; and a drain electrode contacting the channel layer at portion of the exposed portion, in respective order. The channel layer includes oxide semiconductor. Surface of the channel protection layer includes upper surface and side surface extending from the upper surface to the exposed portion. The drain electrode has: a rising portion extending from above the exposed region to the channel layer along the side surface; and an upper surface covering portion continuous with the rising portion and extending onto portion of the upper surface. The upper surface covering portion has a facing portion facing a channel region and being 2.5 μm or less in channel length direction.

10 Claims, 18 Drawing Sheets

(51) Int. Cl.
  *H01L 29/423* (2006.01)
  *H01L 29/417* (2006.01)
  *H01L 27/12* (2006.01)
  *H01L 29/66* (2006.01)

(52) U.S. Cl.
  CPC ... *H01L29/42356* (2013.01); *H01L 29/66969* (2013.01); *H01L 29/78606* (2013.01); *H01L 29/78696* (2013.01)

(56) References Cited

U.S. PATENT DOCUMENTS

| | | |
|---|---|---|
| 8,445,902 B2 | 5/2013 | Sato et al. |
| 8,796,692 B2 | 8/2014 | Kanegae et al. |
| 8,906,738 B2 | 12/2014 | Ishii et al. |
| 9,012,910 B2 | 4/2015 | Oda |
| 9,035,385 B2 | 5/2015 | Kanegae et al. |
| 9,093,541 B2 | 7/2015 | Kitakado et al. |
| 9,111,803 B2 | 8/2015 | Oda et al. |
| 2010/0051936 A1 | 3/2010 | Hayashi et al. |
| 2010/0065837 A1 | 3/2010 | Omura et al. |
| 2010/0065844 A1 | 3/2010 | Tokunaga |
| 2011/0042670 A1 | 2/2011 | Sato et al. |
| 2012/0112182 A1 | 5/2012 | Ishii et al. |
| 2012/0168750 A1 | 7/2012 | Hayashi et al. |
| 2012/0199891 A1 | 8/2012 | Suzuki et al. |
| 2013/0153028 A1 | 6/2013 | Hayashi et al. |
| 2013/0168678 A1 | 7/2013 | Hayashi et al. |
| 2014/0035478 A1 | 2/2014 | Kitakado et al. |
| 2015/0028332 A1 | 1/2015 | Oda |
| 2015/0084048 A1 | 3/2015 | Hayashi et al. |
| 2015/0108477 A1 | 4/2015 | Tokunaga |

FOREIGN PATENT DOCUMENTS

| | | |
|---|---|---|
| JP | 06-112222 | 4/1994 |
| JP | 2008-166716 | 7/2008 |
| JP | 2009-272427 | 11/2009 |
| JP | 2010-073894 | 4/2010 |
| JP | 2011-009393 | 1/2011 |
| JP | 2011-048215 | 3/2011 |
| JP | 2012-099757 | 5/2012 |
| JP | 2012-124367 | 6/2012 |
| WO | 2011/043300 | 4/2011 |
| WO | 2012/117936 | 9/2012 |
| WO | 2013/105473 | 7/2013 |

THIN-FILM TRANSISTOR ELEMENT, METHOD FOR MANUFACTURING SAME, AND DISPLAY DEVICE

TECHNICAL FIELD

The present invention relates to a thin-film transistor, a method for manufacturing the same, and a display device provided with such an element, and in particular to technology for controlling variations in the properties of a thin-film transistor provided with a channel layer that includes oxide semiconductor.

BACKGROUND ART

In liquid crystal display devices, organic electroluminescence (EL) display devices, and the like of the active matrix drive type, a thin-film transistor (TFT) is commonly used as a driving element for each sub pixel.

Recent years have seen active research and development of a configuration in which oxide semiconductor such as zinc oxide (ZnO), indium gallium oxide (InGaO), or indium gallium zinc oxide (InGaZnO) is used in the channel layer of a TFT element. TFT elements in which oxide semiconductor is used in the channel layer are characterized by having a small OFF current, having a high carrier mobility even in the amorphous state, and being able to be formed by a low-temperature process.

The properties of oxide semiconductor are likely to degrade due to damage from sputtering, etching, and the like. Therefore, in many cases, TFT elements in which oxide semiconductor is used employs a structure of the inverted-staggered (bottom gate/top contact) type and of the channel protection type as shown in FIG. 16C (e.g., see Patent Literatures 1, 2, 3, and 4).

A wiring pattern for the source electrode and the drain electrode of a TFT element having the above-described structure is formed in the following manner, for example. First, as shown in FIG. 16A, a photoresist 801 applied on a metal film 9018 is exposed to light via a photomask 701. Then, as shown in FIG. 16B, only the exposed portion of the photoresist 801 is removed, and thus photoresists 8011 and 8012 that have been patterned are formed. Furthermore, as shown in FIG. 16C, a portion of the metal film 9018 on which the photoresists 8011 and 8012 are not deposited is etched. Source electrode 9016 and drain electrode 9017 that have been patterned can be formed by thereafter removing the photoresists 8011 and 8012.

CITATION LIST

Patent Literature

[Patent Literature 1]
Japanese Patent Application Publication No. 2008-166716
[Patent Literature 2]
WO 2011/043300
[Patent Literature 3]
Japanese Patent Application Publication No. 2012-99757
[Patent Literature 4]
Japanese Patent Application Publication No. 2012-124367

SUMMARY OF INVENTION

Technical Problem

The inventors of the present invention have discovered that in the case of using oxide semiconductor in the channel layer of a TFT element of the inverted-staggered type and of the channel protection type, there are cases where the curve that indicates the carrier mobility of the channel region relative to the gate voltage (hereinafter referred to as "a mobility curve") has an extreme peak (hereinafter referred to as "the peak of a mobility curve") when the gate voltage is close to the threshold voltage (the gate-source voltage with which the TFT element is turned ON). In some cases, a TFT element whose mobility curve has a peak operates in an erratic manner when the gate voltage is close to the threshold voltage. Also, a display device having such a TFT element is degraded in the display quality and the reliability.

In view of the above, the present invention aims to provide a TFT element that has a mobility curve with a suppressed peak despite the use of oxide semiconductor in the channel layer, a method for manufacturing the same, and a display device having such an element.

Solution to Problem

One aspect of the present invention provides a thin-film transistor comprising: a gate electrode; a channel layer disposed above the gate electrode and not adjacent to the gate electrode; a channel protection layer covering a portion of the channel layer and exposing a portion of the channel layer; a source electrode that is in contact with the channel layer at a source contact region that is a portion of an exposed portion of the channel layer; and a drain electrode that is not adjacent to the source electrode and is in contact with the channel layer at a drain contact region that is a portion of the exposed portion, the drain contact portion being different from the source contact region, wherein the channel layer includes oxide semiconductor, a surface of the channel protection layer includes an upper surface and a side surface that extends from the upper surface to the exposed portion, the drain electrode has: a rising portion that extends from above the drain contact region to the channel layer along the side surface of the channel protection layer; and an upper surface covering portion that is continuous with the rising portion and extends onto a portion of the upper surface of the channel protection layer, the upper surface covering portion has a facing portion that faces a channel region that is a region of the channel layer interposed between the source contact region and the drain contact region, and the facing portion has a length that is smaller than or equal to 2.5 μm in a channel length direction in which a straight line that connects the source contact region with the drain contact region along a shortest distance therebetween extends.

Advantageous Effects of Invention

The TFT element according to the above-described aspect can suppress the electric field effect of the facing portion on the channel region due to drain voltage. Therefore, the TFT element according to the one aspect of the present invention can suppress the peak of the mobility curve despite the use of oxide semiconductor in the channel layer.

BRIEF DESCRIPTION OF DRAWINGS

FIG. 11 is a circuit configuration diagram of a sub pixel 20a.

DESCRIPTION OF EMBODIMENTS

Definitions of Terms

First, the terms that are used in the present Description are defined below.

The term "channel region" refers to, of the channel layer of a TFT element, the region that is interposed between a source contact region (a region of the channel layer in contact with the source electrode) with a drain contact region (a region of the channel layer in contact with the drain electrode). For example, in FIG. 2 and FIG. 17, regions 1014c and 9014c that are interposed between source contact regions 1014a and 9014a with drain contact regions 1014b and 9014b, respectively, are channel regions.

The term "channel length direction" refers to the direction in which the straight line that connects a source contact region with a drain contact region along the shortest distance therebetween extends. For example, in FIG. 2 and FIG. 17, the direction that is parallel with the X axis is the channel length direction.

<Background Leading to One Aspect of Present Invention>

1. Discovery of Problems

Figure 16A:
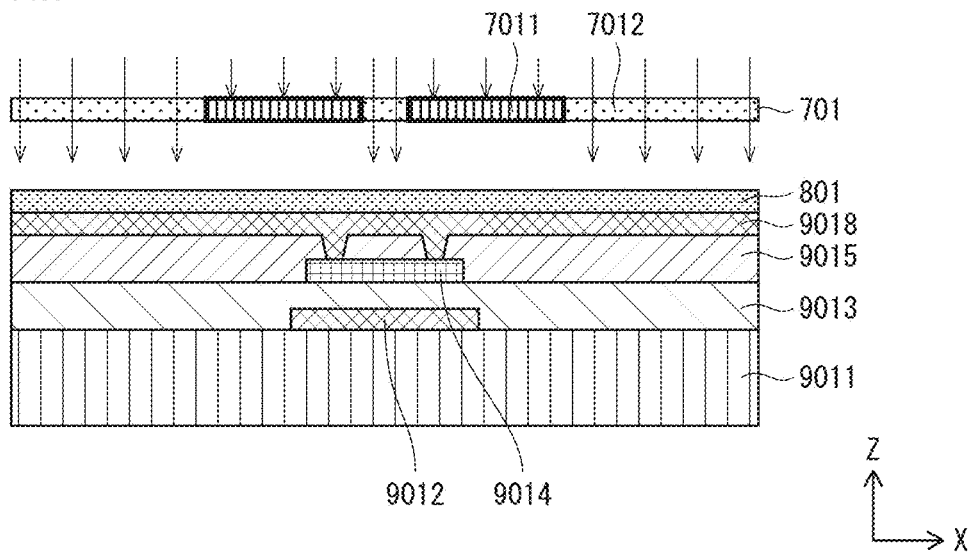
FIGS. 16A to 16C are schematic cross-sectional diagrams each showing a part of the process of manufacturing a TFT element 901.
Figure 16B:
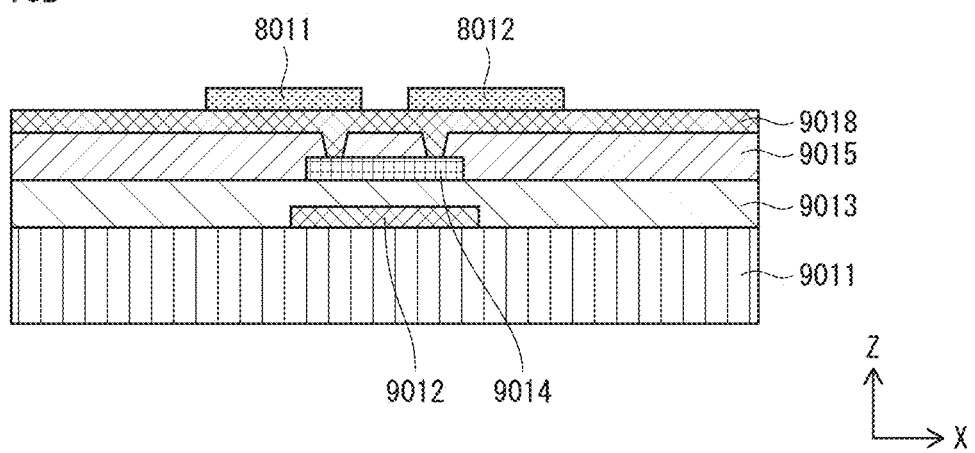
Figure 16C:
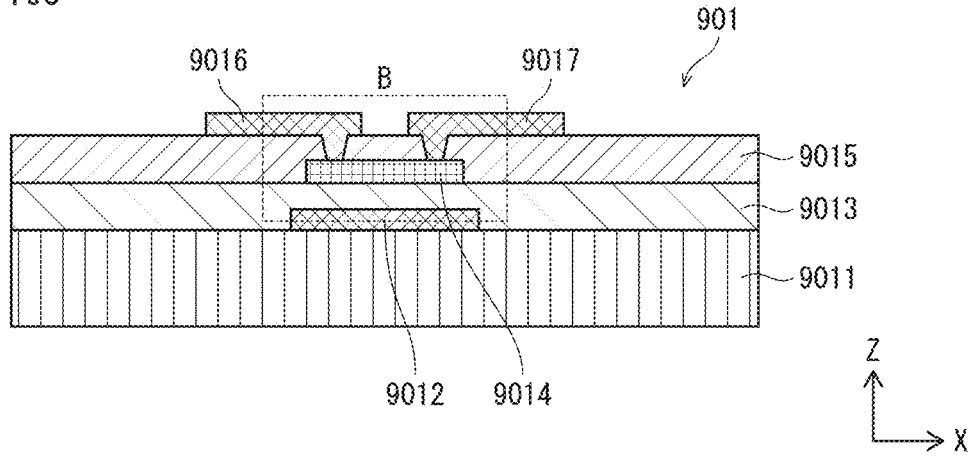
Figure 18:
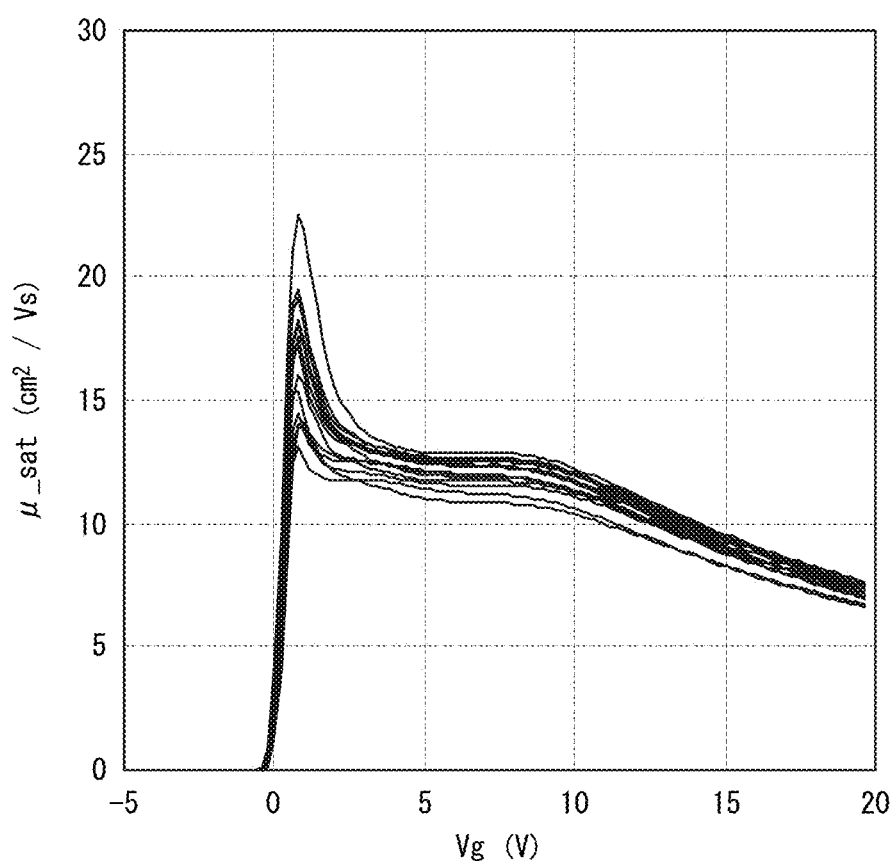
FIG. 18 is a graph showing the mobility curve of the TFT element 901.

Regarding a TFT element 901 that has a configuration of the inverted-staggered type and of the channel protection type shown in FIG. 16C and that uses oxide semiconductor in a channel layer 9014, the inventors of the present invention have discovered the problems a. to c. listed below. Note that the TFT element 901 includes a substrate 9011, a gate electrode 9012, a gate insulation layer 9013, the channel layer 9014, a channel protection layer 9015, a source electrode 9016, and a drain electrode 9017.

a. As shown in FIG. 18, the mobility curve of the TFT element 901 has a peak in some cases. Note that FIG. 18 shows the measurement data of each TFT element 901 of a TFT substrate provided with a plurality of TFT elements 901, where the horizontal axis indicates the gate voltage ($V_g$: measured in V) and the vertical axis indicates the carrier mobility of the channel region ($\mu\_sat$: measured in $cm^2/(V \cdot s)$).

b. As shown in FIG. 18, the maximum value of the peak of the mobility curve greatly varies among the TFT elements 901 in the same TFT substrate.

c. When reliability evaluation involving application of stress is performed on a TFT element 901 whose mobility curve has a peak, the maximum value of the peak of the mobility curve greatly varies between before and after the application of stress, even in the same TFT element 901.

The mobility of the channel region is a fundamental property of a TFT element, and in some cases, as shown in a. above, a TFT element whose mobility curve has a peak operates in an erratic manner when the gate voltage is close to the threshold voltage. Also, a display device having TFT elements controls the luminance of sub pixels by using the TFT elements. Therefore, as shown in b. above, if the mobility greatly varies among the TFT elements 901 in the TFT substrate, it will be difficult to make a luminance adjustment among the sub pixels, and the display device will be degraded in the display quality. Also, as shown in c. above, if the mobility of the TFT element 901 varies over time, the correlation between the signal voltage and the luminance of the sub pixels will vary over time, and the display device will be degraded in the reliability.

In view of the above, the inventors of the present invention have considered to develop a TFT element that can suppress the peak of the mobility curve despite the use of oxide semiconductor in the channel layer.

2. Hypothesis

Figure 17:
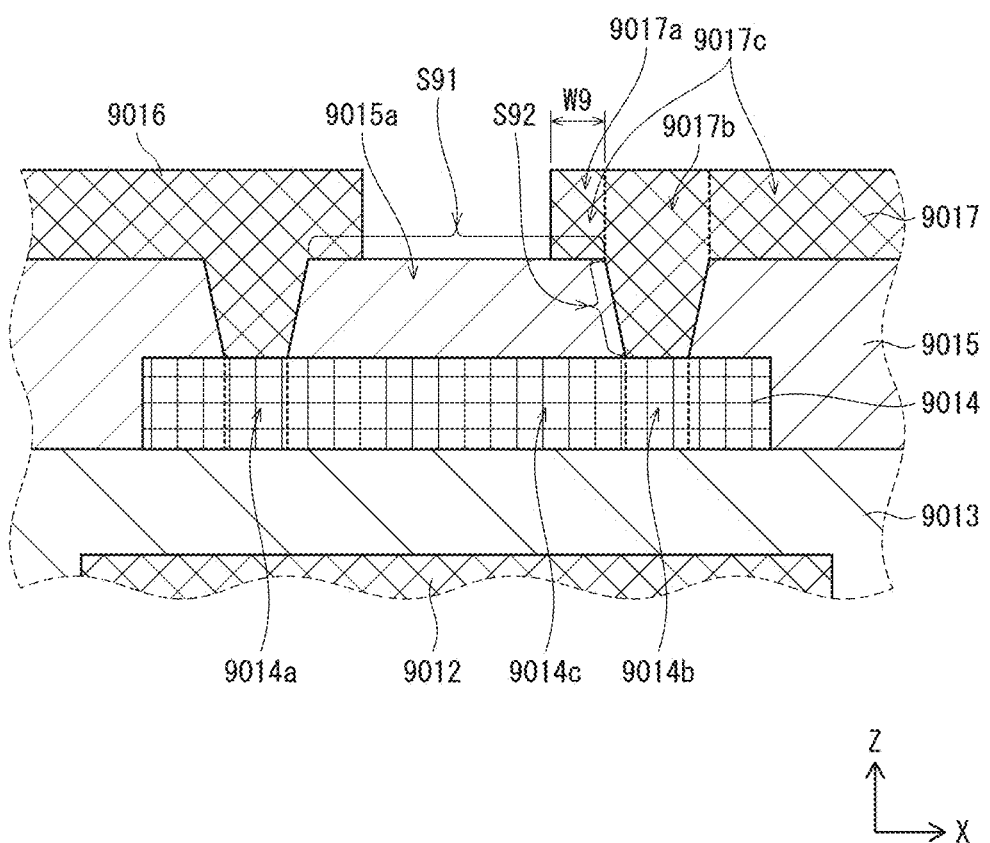
FIG. 17 is a schematic cross-sectional diagram that magnifies a portion B in FIG. 16C.

Regarding the TFT element 901, the inventors of the present invention focused on the issue described below. FIG. 17 is a schematic cross-sectional diagram that magnifies a portion indicated by a sign B in FIG. 16C, which is surrounded by a frame of a dotted line.

As shown in FIG. 17, the channel protection layer 9015 of the TFT element 901 has a protection portion 9015a that covers a channel region 9014c. Also, the drain electrode 9017 of the TFT element 901 includes an upper surface covering portion 9017c that is layered on an upper surface S91 of the channel protection layer 9015, and the upper surface covering portion 9017c includes a facing portion 9017a that is located on the protection portion 9015a side and faces the channel region 9014c. Since drain voltage is applied to the facing portion 9017a and the channel protection layer 9015 is an insulation film, the facing portion 9017a provides the electric field effect to the channel region 9014c in the same manner as the gate electrode 9012 does. Note that the length W9 of the facing portion 9017a in the channel length direction is typically greater than or equal to 3 μm.

Note that oxide semiconductor is likely to cause oxygen deficiency due to plasma and particles colliding therewith. The regions of oxide semiconductor in which oxygen deficiency occurred have a reduced resistance. Therefore, the region on the upper side in the Z axis direction (hereinafter referred to as "the back channel side") of the channel layer 9014 shown in FIG. 17 has a reduced resistance due to plasma or the like having collided therewith during the formation of the channel protection layer 9015.

Based on the issue above, the inventors of the present invention made the following hypotheses about the phenomenon that occurs in a TFT element 901 whose mobility curve has a peak, according to conditions of the gate voltage.

(1) Under the Condition where the Gate Voltage is Close to the Threshold Voltage, i.e., the Gate Voltage is Low Relative to the Drain Voltage In the channel region 9014c in the vicinity of the drain electrode 9017, the facing portion 9017a has a greater electric field effect than the gate electrode 9012. Consequently, in the channel region 9014c in the vicinity of the drain electrode 9017, an accumulation layer is formed on the back channel side. Therefore, in the vicinity of the drain electrode 9017, carriers move mainly on the low resistance back channel side of the channel region 9014c. Accordingly, the carrier mobility under this condition increases to be higher than an ordinary value.

(2) Under the Condition where the Gate Voltage and the Drain Voltage are Similar The gate voltage increases, and the gate electrode 9012 has a greater electric field effect than the facing portion 9017a in the channel region 9014c in the vicinity of the drain electrode 9017 as well. Consequently, an accumulation layer is formed on the gate electrode 9012 side in the channel region 9014c in the vicinity of the drain electrode 9017 as well. Therefore, under this condition, carriers move mainly on the gate electrode 9012 side of the channel region 9014c in the vicinity of the drain electrode 9017 as well. However, due to more than a little influence of the electric field effect of the facing portion 9017a, the electric field effect of the gate voltage is cancelled out in the vicinity of the drain electrode 9017. Accordingly, the carrier mobility under this condition decreases to be lower than an ordinary value.

(3) Under the Condition where the Gate Voltage is Sufficiently High Relative to the Drain Voltage The electric field effect of the facing portion 9017a on the channel region 9014c becomes negligible. Accordingly, the carrier mobility under this condition is an ordinary value.

When the hypotheses (1) to (3) above are true, along with the gate voltage being increased, the mobility curve increases to be higher than an ordinary value in the vicinity of the threshold voltage, then decreases to be lower than an ordinary value, and after a while, approaches an ordinary value. The inventors of the present invention have considered that this transition results in the mobility curve having a peak. Note that "an ordinary value of the carrier mobility" mentioned above refers to a value of the carrier mobility of the channel region 9014c in the case where the electric field effect of the facing portion 9017a is not present.

3. Verification

Next, the inventors of the present invention conducted a verification of the hypotheses above, employing a simulation. In the simulation, a TFT element of the inverted-staggered type and of the channel protection type was set up, and the current density and the mobility curve of the channel region were obtained.

Note that the configuration of the TFT element subjected to the simulation is as follows. The gate insulation layer was set up as films including a silicon nitride ($SiN_x$) film and a silicon oxide ($SiO_2$) film layered one after the other. A channel layer 5024 was set up as an amorphous InGaZnO film. The channel protection layer was set up as a silicon oxide ($SiO_2$) film.

Figure 3A:
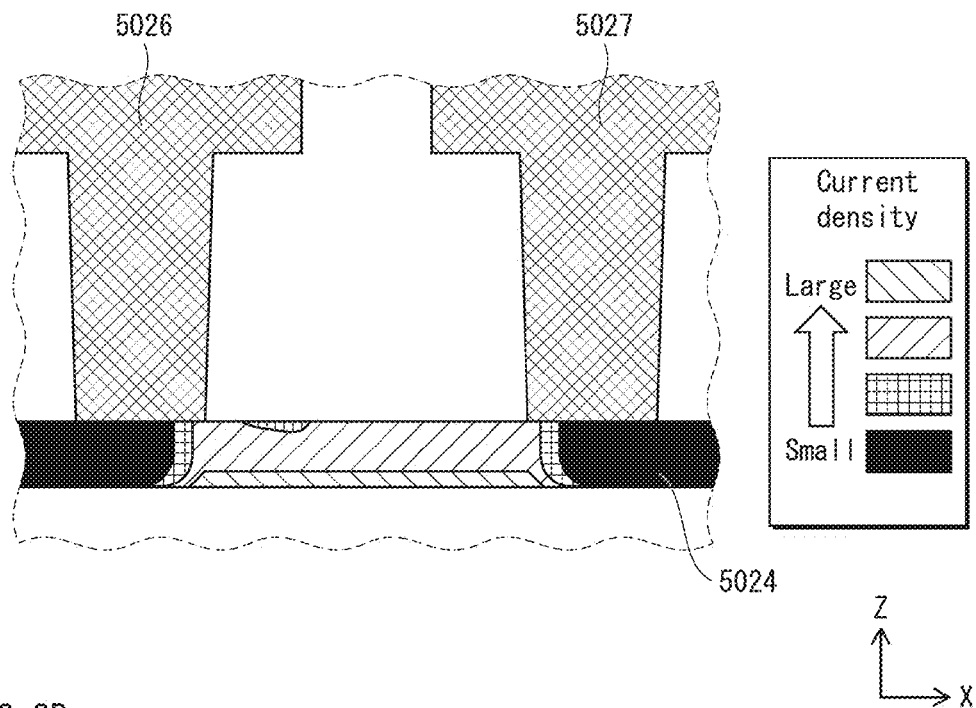
FIG. 3A is a simulation diagram showing the current density of a channel layer 5024 when $V_d$ is 1 V.
Figure 3B:
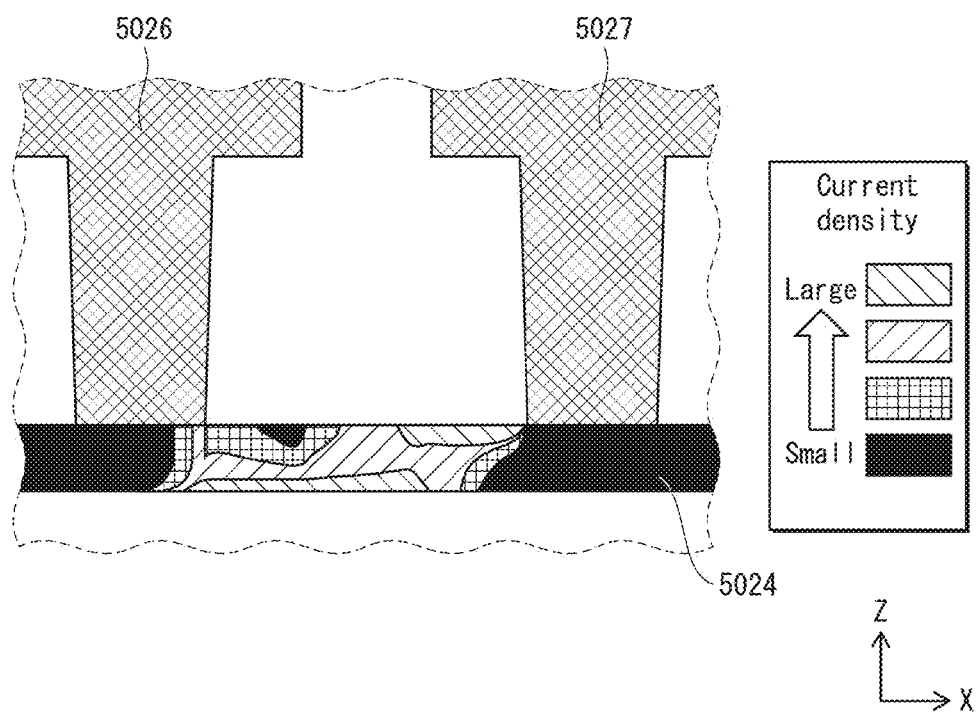
FIG. 3B is a simulation diagram when $V_d$ is 20 V.

FIGS. 3A and 3B are schematic diagrams showing simulation results about the density of the current that flows through the channel layer 5024 of the TFT element having the above-described configuration. FIG. 3A shows the results under the condition where the source voltage ($V_s$) is 0 V, the gate voltage ($V_g$) is 10 V, and the drain voltage ($V_d$) is 1 V. FIG. 3B shows the results under the condition where $V_d$ is 20 V, which is different from the condition of FIG. 3A only in $V_d$. Note that in FIGS. 3A and 3B, the current density is not depicted for currents passing through a source electrode 5026 and a drain electrode 5027.

As shown in FIG. 3A, under the condition where the drain voltage is low relative to the gate voltage, the current density is high on the lower side in the Z axis direction (gate electrode side) of the channel layer 5024. That is, carriers under this condition move mainly on the gate electrode side. In contrast, as shown in FIG. 3B, under the condition where the drain voltage is high relative to the gate voltage, the current density is high on the upper side in the Z axis direction (the back channel side) of the channel layer 5024 in the vicinity of the drain electrode 5027. That is, carriers under this condition move mainly on the back channel side in the vicinity of the drain electrode 5027.

Thus, it is shown that under the condition where the drain voltage is high, the facing portion of the drain electrode 5027 has a greater electric field effect than the gate electrode, and carriers move mainly on the back channel side of the channel region.

Figure 4:
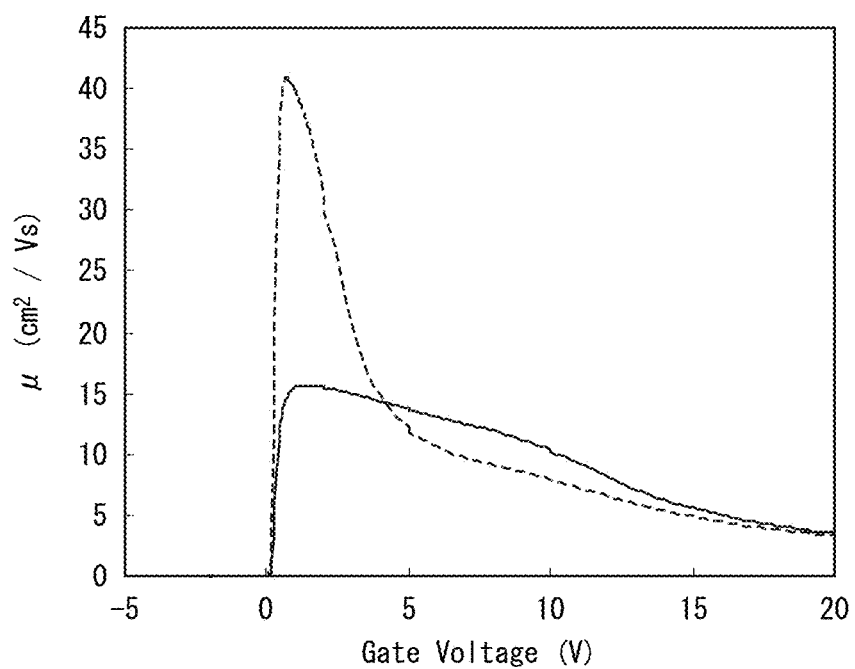
FIG. 4 is a simulation diagram of a mobility curve.

Next, FIG. 4 is a diagram showing the simulation results about the mobility curve of the TFT element having the above-described configuration. In the simulation, the carrier mobility of the channel region was calculated under the condition where $V_s$ is 0 V and $V_d$ is 10 V with $V_g$ varying. Also, regarding the drain electrode 5027 of the TFT element, a simulation was performed for both the case where the facing portion is present and the case where the facing portion is not present. In FIG. 4, the dotted curve is the mobility curve in the case where the facing portion is present in the drain electrode 5027. The solid curve is the mobility curve in the case where the facing portion of the drain electrode 5027 is not present.

As shown in FIG. 4, the presence or absence of the facing portion of the drain electrode 5027 coincides with the presence or absence of the peak of the mobility curve. Also, from when $V_g$ is approximately 5 V to when $V_g$ is approximately 15 V, the carrier mobility in the case where the facing portion is present (the dotted line) is lower than the carrier mobility in the case where the facing portion is not present (the solid line). Then, when $V_g$ is approximately 20 V, there is almost no difference in the carrier mobility, regardless of the presence or absence of the facing portion. These results match the hypotheses (1) to (3) made by the inventors of the present invention.

Thus, as a result of the above-described simulation, it is shown that the peak of the mobility curve occurs due to the electric field effect of the facing portion of the drain electrode on the channel region. The inventors of the present invention thus discovered the correlation between the peak of the mobility curve and the facing portion of the drain electrode, and have been led to one aspect of the present invention.

<Outline of Aspects of the Present Invention>

A thin-film transistor according to one aspect of the present invention comprises: a gate electrode; a channel layer disposed above the gate electrode and not adjacent to the gate electrode; a channel protection layer covering a portion of the channel layer and exposing a portion of the channel layer; a source electrode that is in contact with the channel layer at a source contact region that is a portion of an exposed portion of the channel layer; and a drain electrode that is not adjacent to the source electrode and is in contact with the channel layer at a drain contact region that is a portion of the exposed portion, the drain contact portion being different from the source contact region, wherein the channel layer includes oxide semiconductor, a surface of the channel protection layer includes an upper surface and a side surface that extends from the upper surface to the exposed portion, the drain electrode has: a rising portion that extends from above the drain contact region to the channel layer along the side surface of the channel protection layer; and an upper surface covering portion that is continuous with the rising portion and extends onto a portion of the upper surface of the channel protection layer, the upper surface covering portion has a facing portion that faces a channel region that is a region of the channel layer interposed between the source contact region and the drain contact region, and the facing portion has a length that is smaller than or equal to 2.5 µm in a channel length direction in which a straight line that connects the source contact region with the drain contact region along a shortest distance therebetween extends.

With this configuration, the thin-film transistor according to the present aspect can suppress the electric field effect the facing portion has on the channel region due to drain voltage. Consequently, when the gate voltage is close to the threshold voltage, it is possible to prevent carriers from moving mainly in a low-resistance portion of the channel region. Therefore, the thin-film transistor according to the above-described aspect can suppress the peak of the mobility curve despite the use of oxide semiconductor in the channel layer.

Also, in the thin-film transistor according to another aspect of the present invention, the facing portion has a length that is no smaller than 2.0 µm in the channel length direction. With this configuration, the thin-film transistor according to the present aspect can have a sufficient margin for misalignment of the photomask, diffraction at the time of exposure, or the like, and suppress a decrease in the yield rate.

Also, in the thin-film transistor according to a still another aspect of the present invention, a carrier mobility in the channel region of the thin-film transistor is lower than or equal to 13 $cm^2/(V\cdot s)$. With this configuration, the thin-film transistor according to the present aspect can more reliably prevent the mobility curve from having a peak, and reduce variations in the carrier mobility.

Also, a display device according to a further another aspect of the present invention comprises a plurality of thin-film transistors according to the one aspect or the other aspect of the present invention. With this configuration, the display device according to the present aspect can improve the display performance, and reduce degradation in the image quality and the reliability.

Also, in the display device according to a yet another aspect of the present invention an average value of a carrier mobility in the respective channel regions of the plurality of thin-film transistors is lower than or equal to 13 $cm^2/(V\cdot s)$. With this configuration, the display device according to the present aspect can more reliably reduce degradation in the display quality and the reliability.

Also, a method for manufacturing a thin-film transistor according to another aspect of the present invention comprises: forming a gate electrode; forming a channel layer above the gate electrode so as not to be adjacent to the gate electrode; forming a channel protection layer so as to cover a portion of the channel layer and expose a portion of the channel layer; forming a source electrode so as to be in contact with the channel layer at a source contact region that is a portion of an exposed portion of the channel layer; and forming a drain electrode so as not to be adjacent to the source electrode and be in contact with the channel layer at a drain contact region that is a portion of the exposed portion, the drain contact portion being different from the source contact region, wherein in forming the channel layer, oxide semiconductor is used for forming the channel layer, in forming the channel protection layer, an upper surface and a side surface that extends from the upper surface to the exposed portion are formed as a surface of the channel protection layer, in forming the drain electrode, the drain electrode is formed so as to have a rising portion and an upper surface covering portion, the rising portion extending from above the drain contact region to the channel layer along the side surface of the channel protection layer, the upper surface covering portion being continuous with the rising portion, extending onto a portion of the upper surface of the channel protection layer, and having a facing portion that faces a channel region that is a region of the channel layer interposed between the source contact region and the drain contact region, the facing portion having a length that is smaller than or equal to 2.5 µm in a channel length direction in which a straight line that connects the source contact region with the drain contact region along a shortest distance therebetween extends.

With the manufacturing method according to the present aspect, it is possible to obtain a thin-film transistor that suppresses the electric field effect of the facing portion on the channel region due to drain voltage. Therefore, it is possible to obtain a thin-film transistor element that suppresses the peak of the mobility curve despite the use of oxide semiconductor in the channel layer.

Also, in the manufacturing method according to a still another aspect of the percent invention, when the drain electrode is formed, the facing portion is formed so as to have a length that is no smaller than 2.0 µm in the channel length direction. With the manufacturing method according to the present aspect, it is possible to leave a sufficient margin for misalignment of the photomask, diffraction at the time of exposure, or the like, and it is therefore possible to suppress a decrease in the yield rate of thin-film transistors.

A thin-film transistor according to a further another aspect of the present invention comprises: a gate electrode; a channel layer disposed above the gate electrode and not adjacent to the gate electrode; a channel protection layer covering a portion of the channel layer and exposing a portion of the channel layer; a source electrode that is in contact with the channel layer at a source contact region that is a portion of an exposed portion of the channel layer; and a drain electrode that is not adjacent to the source electrode and is in contact with the channel layer at a drain contact region that is a portion of the exposed portion, the drain contact portion being different from the source contact region, wherein the channel layer includes oxide semiconductor, a surface of the channel protection layer includes an upper surface and a side surface that extends from the upper surface to the exposed portion, the drain electrode has: a rising portion that extends from above the drain contact region to the channel layer along the side surface of the channel protection layer; and an upper surface covering portion that is continuous with the rising portion and extends onto a portion of the upper surface of the channel protection layer, the upper surface covering portion has a facing portion that faces a channel region that is a region of the channel layer interposed between the source contact region and the drain contact region, the facing portion has a length that is smaller than or equal to 2.5 μm in a channel length direction in which a straight line that connects the source contact region with the drain contact region along a shortest distance therebetween extends, and in an xy coordinate system in which points are expressed with coordinates (x, y), a point (W3, T3) is located within a range that is surrounded by a line that connects points (2.00, 209), (2.33, 219), (2.43, 234), (3.29, 291), (3.49, 360), and (4.00, 480), a straight line that connects points (2.00, 209) and (2.00, 480), and a straight line that connects points (2.00, 480) and (4.00, 480), where W3 (μm) denotes a length of the facing portion in a channel length direction in which a straight line that connects the source contact region with the drain contact region along a shortest distance therebetween extends, and T3 (nm) denotes a shortest distance between the channel layer and the facing portion.

With this configuration, the thin-film transistor according to the present aspect can reduce the electric field effect of the facing portion on the channel region due to drain voltage to a level that is no greater than a predetermined level. Consequently, when the gate voltage is close to the threshold voltage, it is possible to prevent carriers from moving mainly in a low-resistance portion of the channel region. Therefore, the thin-film transistor according to the above-described aspect can suppress the peak of the mobility curve despite the use of oxide semiconductor in the channel layer. Also, the thin-film transistor according to the above-described aspect can suppress a decrease in the yield rate and prevent a break from occurring in the source electrode and the drain electrode.

Also, in the thin-film transistor according to a yet another aspect of the present invention, in the xy coordinate system, the point (W3, T3) is located within a range that is surrounded by a line that connects points (2.00, 344), (2.06, 341), (2.97, 352), (3.02, 356), (3.22, 390), and (3.48, 480), a straight line that connects points (2.00, 344) and (2.00, 480), and a straight line that connects points (2.00, 480) and (3.48, 480). With this configuration, the thin-film transistor according to the present aspect can further suppress the electric field effect of the facing portion on the channel region and sufficiently suppress the peak of the mobility curve.

Also, a display device according to another aspect of the present invention comprises a plurality of thin-film transistors according to the further another aspect or the yet another aspect of the present invention. With this configuration, the display device according to the present aspect can improve the display performance, and reduce degradation in the image quality and the reliability.

Note that the upward direction mentioned in the present Description does not refer to the upward direction (vertically upward direction) according to absolute space recognition, but is defined by a relative positional relationship based on the order of the layers in the multilayer structure of the TFT element. Specifically, in the TFT element, the direction that is orthogonal to the main surface of the substrate and that is directed from the substrate to the layers is referred to as the upward direction.

The following describes the features, functions, and advantageous effects of aspects according to the present invention, using some specific examples.

Embodiment 1

The following describes a TFT element 101 of the inverted-staggered type and of the channel protection type according to Embodiment 1 of the present invention.

1. Cross-Sectional Configuration of TFT Element 101

Figure 1:
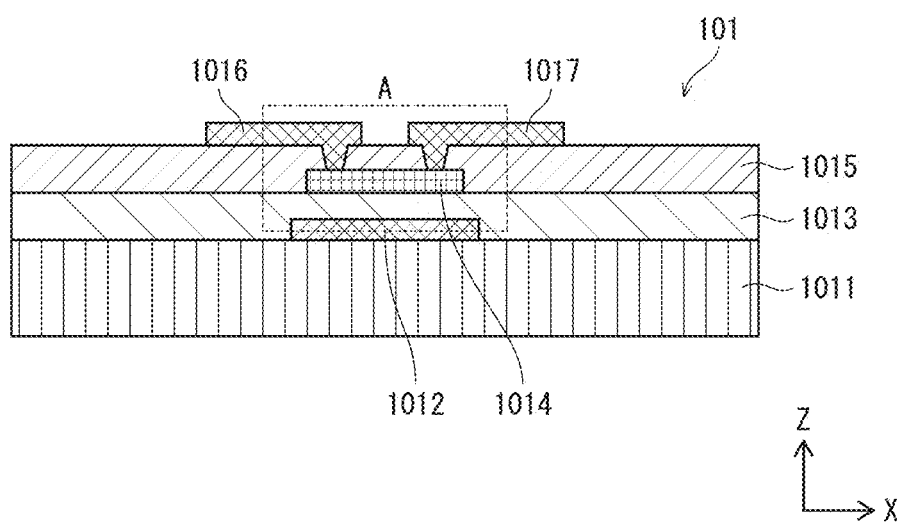
FIG. 1 is a schematic cross-sectional diagram showing the configuration of a TFT element 101 according to Embodiment 1 of the present invention.

The following describes a cross-sectional configuration of the TFT element 101 with reference to FIG. 1.

As shown in FIG. 1, in the TFT element 101, a gate electrode 1012 is disposed on a substrate 1011. Furthermore, a gate insulation layer 1013 is disposed to cover the gate electrode 1012.

Also, a channel layer 1014 is disposed on the gate insulation layer 1013, i.e., above the gate electrode 1012, and is not adjacent to the gate electrode 1012. Furthermore, a channel protection layer 1015 is disposed to cover the channel layer 1014. A portion of the channel protection layer 1015 on the channel layer 1014 is provided with a contact hole, and a portion of the channel layer 1014 is exposed from the channel protection layer 1015.

Also, a source electrode 1016, and a drain electrode 1017 which is not adjacent to the source electrode 1016, are disposed on the channel protection layer 1015. The source electrode 1016 and the drain electrode 1017 are formed in the contact hole of the channel protection layer 1015 as well. Thus, the source electrode 1016 and the drain electrode 1017 are in contact with, and electrically connected with, the portion of the channel layer 1014 exposed from the channel protection layer 1015.

Figure 2:
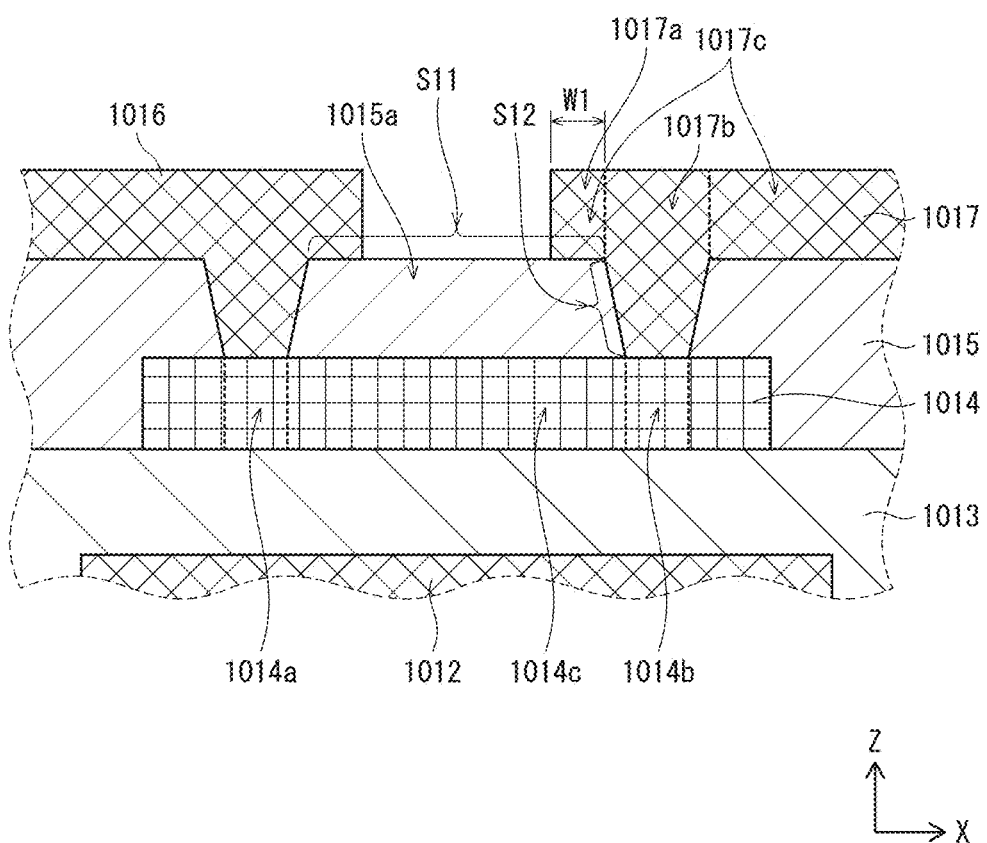
FIG. 2 is a schematic cross-sectional diagram that magnifies a portion A in FIG. 1.

Here, as shown in FIG. 2, of the exposed portion of the channel layer 1014, a portion that is in contact with the source electrode 1016 is defined as a source contact region 1014a, and a portion that is in contact with the drain electrode 1017 is defined as a drain contact region 1014b. Note that the source contact region 1014a and the drain contact region 1014b each include not only a portion of the upper surface exposed from the channel protection layer 1015 but also a portion of the channel layer 1014 below the upper surface.

Also, in the TFT element 101, the channel protection layer 1015 has a protection portion 1015a that covers a channel region 1014c. Furthermore, an upper surface S11, and a side surface S12 that extend from the upper surface S11 to an exposed portion of the channel layer 1014 (e.g., the drain contact region 1014b) are present on the surface of the channel protection layer 1015. The side surface S12 is a surface that has been formed by a development process, etching, and so on which have been performed after the formation of a film of the material of the channel protection layer 1015, for example.

Also, the drain electrode 1017 has a rising portion 1017b that extends from above the drain contact region 1014b along the side surface S12, and an upper surface covering portion 1017c that is continuous with the rising portion 1017b and extends onto a portion of the upper surface S11. Furthermore, the upper surface covering portion 1017c has a facing portion 1017a, which is a portion that faces the channel region 1014c, on the protection portion 1015a side.

In the TFT element 101, the length W1 of the facing portion 1017a in the channel length direction is smaller than or equal to 2.5 µm.

2. Constituent Material of TFT Element 101

In the TFT element 101, each of the constituent elements may be formed with the following materials, for example.

(1) Substrate 1011

In the substrate 1011, an electrically insulative material can be used. For example, a glass material such as alkali-free glass, quarts glass, or high heat-resistance glass, a resin material such as polyethylene, polypropylene, or polyimide, a semiconductor material such as silicon or gallium arsenide, or a metal material such as a stainless coated with an insulation layer can be used.

(2) Gate Electrode 1012

In the gate electrode 1012, an electrically conductive material can be used. For example, metal such as molybdenum (Mo), aluminum, copper (Cu), tungsten, titanium, manganese (Mn), chromium, tantalum, niobium, silver, gold, platinum, palladium, indium, nickel, or neodymium, metal alloy, conductive metal oxide such as indium tin oxide (ITO), aluminum doped zinc oxide (AZO), gallium doped zinc oxide (GZO), or electrically conductive polymer such as polythiophene or polyacetylene can be used. Also, a multilayer structure with layers of the above may be adopted.

(3) Gate Insulation Layer 1013

In the gate insulation layer 1013, an electrically insulative material can be used. For example, a single layer structure of a silicon oxide film, a silicon nitride film, a silicon oxynitride film, an aluminum oxide film, a tantalum oxide film, or a hafnium oxide film, or a multilayer structure with layers of the aforementioned films can be used.

(4) Channel Layer 1014

An oxide semiconductor material that includes at least one of indium (In), gallium (Ga), and zinc (Zn) is used in the channel layer 1014. For example, amorphous indium gallium zinc oxide (InGaZnO) can be used.

(5) Channel Protection Layer 1015

In the channel protection layer 1015, an electrically insulative material that can protect the channel layer 1014 against damage from spattering or etching can be used. For example, a single layer structure of a film of inorganic material such as a silicon oxide film, a silicon nitride film, a silicon oxynitride film, or an aluminum oxide film, or a film that contains mainly organic material that includes silicon, oxygen, and carbon, or a multilayer structure with layers of the aforementioned films can be used.

(6) Source Electrode 1016 and Drain Electrode 1017

In the source electrode 1016 and the drain electrode 1017, the same material as the material used for forming the gate electrode 1012 can be used, for example.

3. Method for Manufacturing TFT Element 101

The following describes a method for manufacturing the TFT element 101 with reference to FIGS. 5A to 5C and FIGS. 6A and 6B.

(1) Formation of Gate Electrode 1012

Figure 5A:
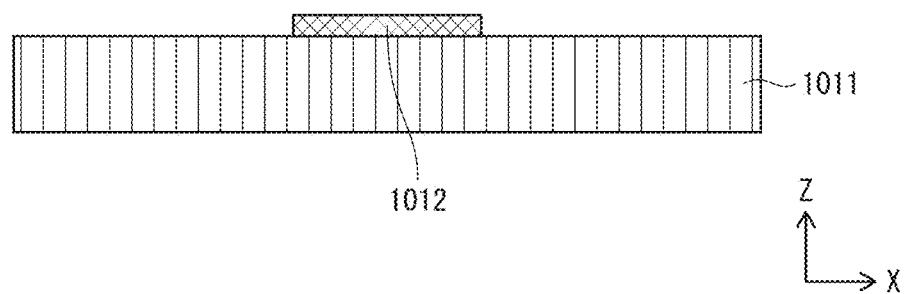
FIG. 5A is a schematic cross-sectional diagram showing a gate electrode forming step included in the process of manufacturing the TFT element 101.

First, as shown in FIG. 5A, the gate electrode 1012 is formed on the substrate 1011. For example, a glass substrate, which serves as the substrate 1011, is prepared, and an Mo film and a Cu film are sequentially formed on the substrate 1011 by a sputtering method. Then, the Mo film and the CU film are patterned by a photolithography method and a wet etching method, and thus the gate electrode 1012 can be formed. The film thickness of the gate electrode 1012 is approximately 20 nm to 500 nm, for example. Wet etching on the Mo film and the Cu film can be performed using a chemical solution in which a hydrogen peroxide solution ($H_2O_2$) and organic acid are mixed, for example.

(2) Formation of Gate Insulation Layer 1013

Figure 5B:
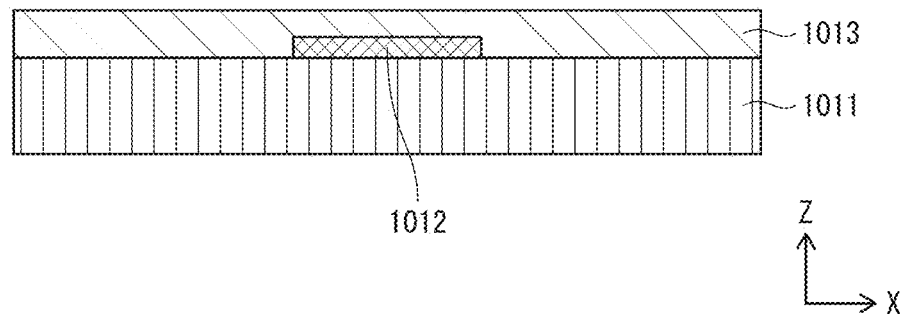
FIG. 5B is a schematic cross-sectional diagram showing a gate insulation layer formation step.

Next, as shown in FIG. 5B, the gate insulation layer 1013 is formed on the substrate 1011 so as to cover the gate electrode 1012. For example, the gate insulation layer 1013 can be formed by sequentially forming a silicon nitride film and a silicon oxide film on the substrate 1011 by a plasma CVD method.

The silicon nitride film can be formed by using a silane ($SiH_4$) gas, an ammonia ($NH_3$) gas, and a nitrogen ($N_2$) gas as introduction gases, for example. The silicon oxide film can be formed by using a silane ($SiH_4$) gas and a nitrous oxide ($N_2O$) gas as introduction gases, for example. The film thickness of the gate insulation layer 1013 is 50 nm to 300 nm, for example.

(3) Formation of Channel Layer 1014

Figure 5C:
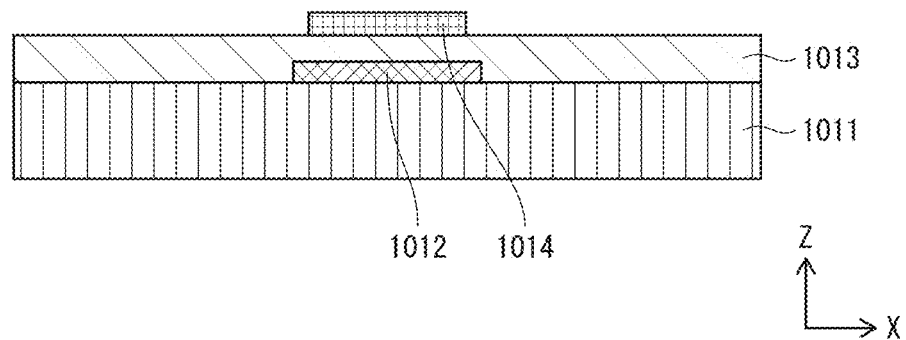
FIG. 5C is a schematic cross-sectional diagram showing a channel layer formation step.

Next, as shown in FIG. 5C, the channel layer 1014 is formed on the gate insulation layer 1013, i.e., above the gate electrode 1012, and is not adjacent to the gate electrode 1012. In this regard, the channel layer 1014 is formed by using oxide semiconductor. For example, first, an amorphous InGaZnO film is formed by sputtering on the gate insulation layer 1013 in an oxygen atmosphere, using a target material with a composition ratio In:Ga:Zn is 1:1:1. Then, patterning is performed by a photolithography method and a wet etching method, and thus the channel layer 1014 can be formed.

The film thickness of the channel layer 1014 is approximately 20 nm to 200 nm, for example. Wet etching on the InGaZnO film can be performed using a chemical solution in which phosphoric acid ($HPO_4$), nitric acid ($HNO_3$), acetic acid ($CH_3COOH$), and water are mixed, for example.

(4) Formation of Channel Protection Layer 1015

Figure 6A:
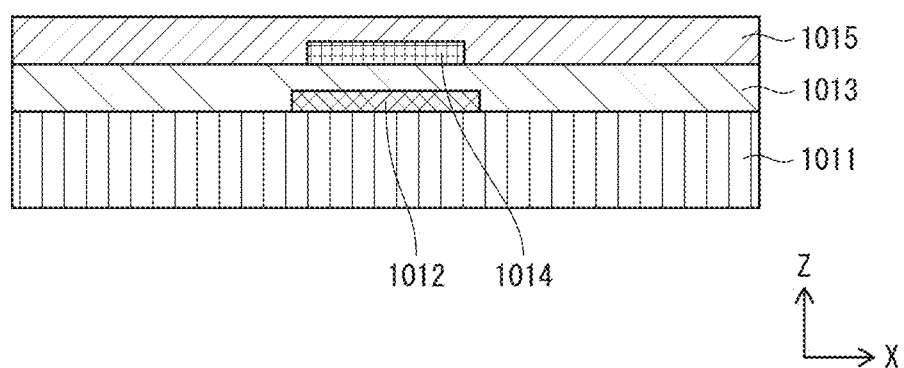
FIG. 6A is a schematic cross-sectional diagram showing a channel protection layer forming step included in the process of manufacturing the TFT element 101.

Next, as shown in FIG. 6A, the channel protection layer 1015 is formed on the gate insulation layer 1013 so as to cover the channel layer 1014. For example, the channel protection layer 1015 can be formed by forming a silicon oxide film on the gate insulation layer 1013 by a plasma CVD method. The film thickness of the channel protection layer 1015 is approximately 50 nm to 500 nm, for example.

(5) Formation of Source Electrode 1016 and Drain Electrode 1017

Figure 6B:
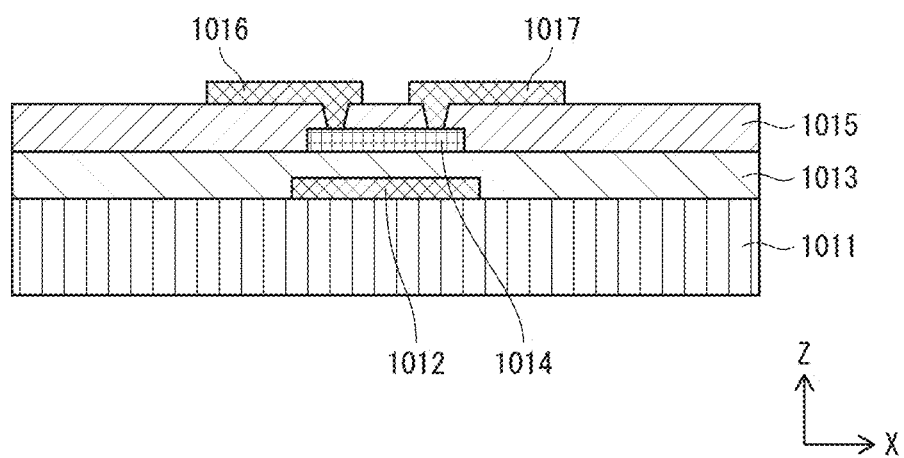
FIG. 6B is a schematic cross-sectional diagram showing a source electrode and drain electrode formation step.

Next, as shown in FIG. 6B, first, a contact hole is formed in the channel protection layer 1015 such that a portion of the channel layer 1014 is exposed. At this time, as shown in FIG. 2, the upper surface S11, and the side surface S12 that extends from the upper surface s11 to the source contact region 1014a and to the drain contact region 1014b, are formed as surfaces of the channel protection layer 1015. Then, the source electrode 1016 and the drain electrode 1017, which are not adjacent to each other, are formed on the channel protection layer 1015. At this time, the source electrode 1016 and the drain electrode 1017 are also formed in the contact hole provided in the channel protection layer 1015, and are thus connected with the channel layer 1014. In other words, the source electrode 1016 and the drain electrode 1017 are formed so as to be in contact with the channel layer 1014, respectively at the source contact region 1014a and the drain contact region 1014b of the channel layer 1014.

Specifically, first, a contact hole is provided above regions of the channel layer 1014, which serve as the source contact region 1014a and the drain contact region 1014b, by etching the channel protection layer 1015 by a photolithography method and a dry etching method. For example, in the case where a silicon oxide film is used as the channel protection layer 1015, reactive ion etching (RIE) can be used as a dry etching method. In this case, a carbon tetrafluoride ($CF_4$) and an oxygen ($O_2$) gas can be used as the etching gas, for example. Parameters such as the gas flow rate, the pressure, the applied power, and the frequency are appropriately set according to the size of the substrate, the set etching film thickness, and so on.

Then, the source electrode 1016 and the drain electrode 1017, which are not adjacent to each other, are formed on the channel protection layer 1015 and in the contact hole provided in the channel protection layer 1015. For example, an Mo film, a Cu film, and a CuMn film are sequentially formed on the channel protection layer 1015 and in the contact hole by sputtering. Furthermore, patterning is performed on the Mo film, the Cu film, and the CuMn film by a photolithography method and a wet etching method, and thus the source electrode 1016 and the drain electrode 1017 can be formed. The film thicknesses of the source electrode 1016 and the drain electrode 1017 are each approximately 100 nm to 500 nm, for example. Wet etching on the Mo film, the Cu film, and the CuMn film can be performed using a chemical solution in which a hydrogen peroxide solution ($H_2O_2$) and organic acid are mixed, for example.

In the drain electrode 1017, the rising portion 1017b shown in FIG. 2 and the upper surface covering portion 1017c including the facing portion 1017a are formed, and in particular, the facing portion 1017a is formed such that the length W1 thereof in the channel length direction is smaller than or equal to 2.5 μm. This configuration can be realized by appropriately setting the photomask pattern when applying the photolithography method, for example.

The TFT element 101 can be manufactured in the above-described manner.

4. Achievable Advantageous Effects

In the TFT element 101 according to the present embodiment, the length W1 of the facing portion 1017a of the drain electrode 1017 in the channel length direction is smaller than or equal to 2.5 μm.

With this configuration, in the TFT element 101, the area of the facing portion 1017a that faces the channel region 1014c can be reduced. Consequently, the electric field effect of the drain voltage on the channel region 1014c can be reduced. Therefore, for example when the gate voltage is close to the threshold voltage, an accumulation layer is unlikely to be formed on the back channel side of the channel region 1014c even under the condition where the drain voltage is high relative to the gate voltage. In other words, it is possible to suppress an abnormal increase in the mobility resulting from carriers moving mainly on the low resistance back channel side.

Therefore, with the TFT element 101, it is possible to suppress an extreme increase in the carrier mobility, i.e., the peak of the mobility curve when the gate voltage is close to the threshold voltage, despite the use of oxide semiconductor in the channel layer 1014.

5. Verification Using Practical Examples

The TFT element 101 according to the present embodiment and a comparative example thereof were actually manufactured, and their effects were verified.

(1) Configurations of Practical Examples and Comparative Example

The configurations of practical examples of the TFT element 101 are as follows.

As the substrate 1011, alkali-free glass substrate was used. In the gate electrode 1012, a multilayer film including an Mo film and a Cu film was used, and their respective film thicknesses were 20 nm and 300 nm. In the gate insulation layer 1013, a multilayer film including a silicon nitride film and a silicon oxide film was used, and their respective film thicknesses were 65 nm and 85 nm. In the channel layer 1014, an amorphous InGaZnO film was used, and the film thickness thereof was 60 nm. In the channel protection layer 1015, a silicon oxide film was used, and the film thickness thereof was 240 nm. In the source electrode 1016 and the drain electrode 1017, a multilayer film including an Mo film, a CU film, and a CuMn film was used, and their respective film thicknesses were 20 nm, 300 nm, and 65 nm.

Note that two kinds of practical examples of the TFT element 101, namely Practical Example 1 whose length W1 is 2.5 μm and Practical Example 2 whose length W1 is 2.0 μm, were prepared, where the length W1 is the length of the facing portion 1017a of the drain electrode 1017 in the channel length direction.

Also, a sample having a configuration that is the same as the practical examples except that the length of the facing portion in the channel length direction is 3.0 μm was prepared as Comparative Example.

Note that the lengths of the facing portion in the practical examples and the comparative example in the channel length direction have a designed value of the photomask used when manufacturing the TFT element.

(2) Mobility Curves of Practical Examples and Comparative Example

The mobility curve was measured for the Practical Example 1, Practical Example 2, and Comparative Example, which have the above-described configurations. To take variations in manufacturing into consideration, a plurality of TFT elements were manufactured for each of Practical Example 1, Practical Example 2, and Comparative Example, and the mobility curve was measured for each.

Figure 7A:
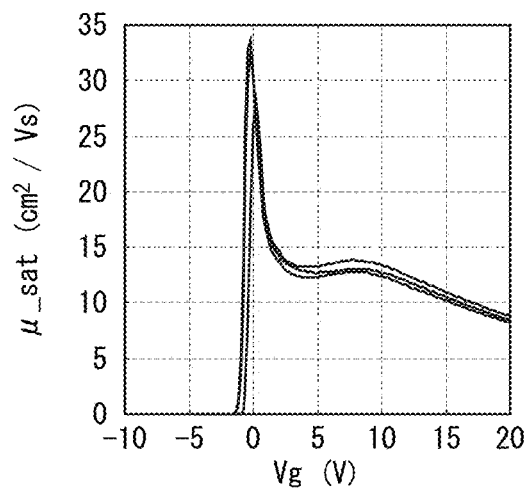
FIG. 7A is a graph showing the mobility curve of Comparative Example.
Figure 7B:
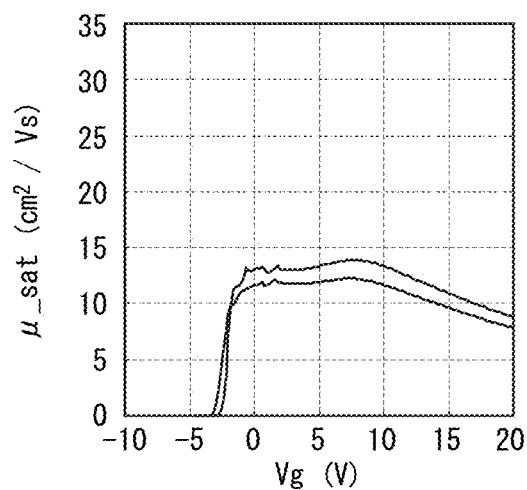
FIG. 7B is a graph showing the mobility curve of Practical Example 1 of the TFT element 101.
Figure 7C:
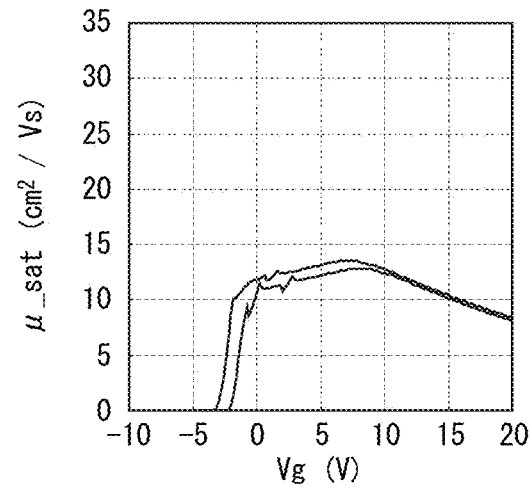
FIG. 7C is a graph showing the mobility curve of Practical Example 2 of the TFT element 101.

FIGS. 7A, 7B, and 7C respectively show the mobility curves of the plurality of manufactured TFT elements manufactured for Comparative Example, Practical Example 1, and Practical Example 2.

Regarding Comparative Example, as shown in FIG. 7A, the mobility curves of all the plurality of manufactured TFT elements have a peak. In contrast, regarding Practical Example 1 and Practical Example 2, as shown in FIG. 7B and FIG. 7C, the mobility curves of none of the plurality of manufactured TFT elements have a peak.

Thus, it is shown that in the TFT element 101, it is possible to prevent the mobility curve from having a peak by setting the length W1 of the facing portion 1017a of the drain electrode 1017 in the channel length direction to be smaller than or equal to 2.5 μm.

6. Others

In the TFT element 101, it is preferable that the length W1 of the facing portion 1017a of the drain electrode 1017 in the channel length direction is greater than or equal to 2.0 μm.

This configuration can leave a margin for avoiding abnormal formation (e.g., over-etching) of the drain electrode 1017 due to misalignment of the photomask, diffraction at the time of exposure, or the like. Therefore, the TFT element 101 having such a configuration can suppress a decrease in the yield rate.

It is also preferable that the carrier mobility in the TFT element 101 is lower than or equal to 13 $cm^2/(V \cdot s)$. The following describes the reasons.

Figure 8:
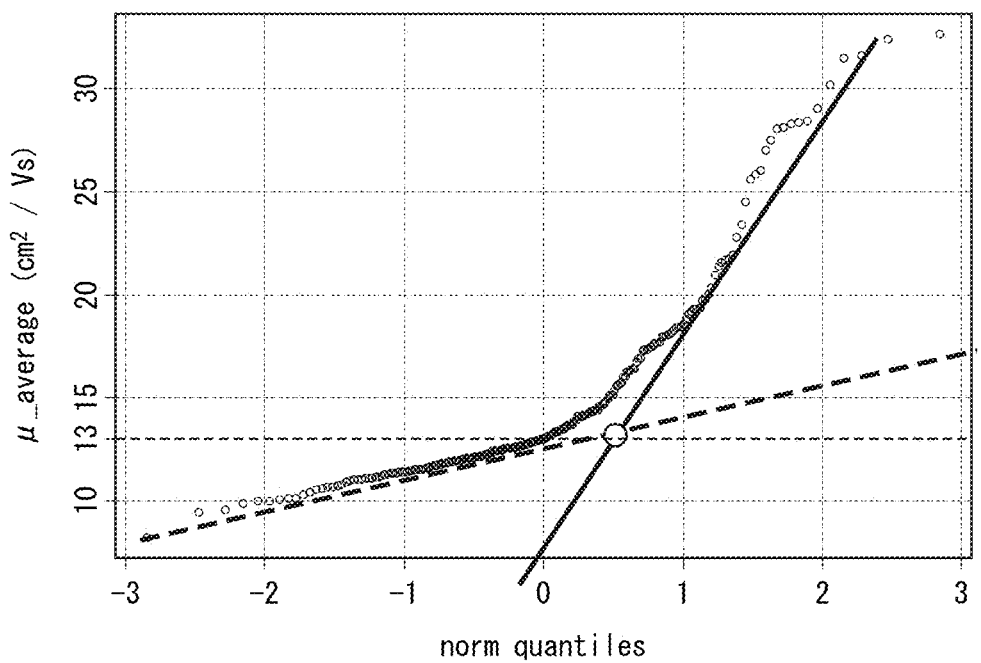
FIG. 8 is a normal probability plot of a carrier mobility.

FIG. 8 is a normal probability plot created by manufacturing a plurality of lots of TFT substrates in each of which a plurality of TFT elements have been formed, and calculating the average of the values of carrier mobility of the TFT elements for each substrate. Here, each TFT element is of the inverted-staggered type and of the channel protection type, and an amorphous InGaZnO film is used in the channel layer thereof. Note that "lot" is the unit of manufacturing, and each lot includes a plurality of TFT substrates manufactured at the same time.

Note that the vertical axis in FIG. 8 (the average of the values of mobility (μ), measured in cm²/(V·s)) is obtained by calculating the maximum value of the saturation current formula shown below for each of the TFT elements in the TFT substrates, based on the drain current $I_d$ measured under the condition where $V_s$ is 0, $V_g$ is −20 V to 20 V, and $V_d$ is 4.1 V, and averaging the maximum values thus obtained, for each TFT substrate. Here, L and W respectively denote, with respect to the channel region, the length in the channel length direction and the length (channel width) in the direction that is orthogonal to the channel length direction, and $C_{ox}$ denotes the capacitance of the gate insulation layer.

$$\mu = \left(\frac{d\sqrt{I_d}}{dV_g}\right)^2 \cdot \frac{2L}{WC_{ox}} \quad \text{[Math. 1]}$$

As shown in FIG. 8, the plot of the average values of the carrier mobility of each TFT substrate does not have the shape of a single straight line, and has the shape of a straight line that is bent upward on the way. This fact means that the range in which the average values of the carrier mobility are low and the range in which the average values of the carrier mobility are high each have a different type of normal distribution (with a different average value and a different standard deviation). The distribution in the range in which the average values of the carrier mobility are low can be approximated to a broken straight line having a small inclination. This broken straight line is hereinafter referred to as a "line A". The distribution in the range in which the average values of the carrier mobility are high can be approximated to a solid straight line having a large inclination. This solid straight line is hereinafter referred to as a "line B".

The manufactured TFT substrates can be classified into the following three types.

(a) TFT substrates in which all of the TFT elements have a peak in the mobility curve thereof (hereinafter referred to as "substrates with a peak").

(b) TFT substrates in which none of the TFT elements has a peak in the mobility curve thereof (hereinafter referred to as "substrates without a peak").

(c) TFT substrates in which TFT elements having a peak in the mobility curve and TFT elements not having a peak are mixed (hereinafter referred to as "substrates with a mix).

As a result of checking the correspondence between the points plotted in FIG. 8 and the classifications of TFT substrates above, it is shown that the distribution of the plotted points corresponding to the substrates with a peak is almost the same as the distribution that can be approximated to the straight line B having a large inclination. Also, the distribution of the plotted points corresponding to the substrates without a peak is almost the same as the distribution that can be approximated to the straight line A having a small inclination. The distribution of the plotted points corresponding to the substrates with a mix is almost the same as the distribution in the intermediate region between these distributions (the region in which the inclination is greater than or equal to that of the straight line A and smaller than or equal to that of the straight line B). Consequently, it can be seen that the peak of the mobility curve has the effect of increasing the average value of the carrier mobility and the standard deviation.

As described above, the substrates with a peak has the normal distribution approximated to the straight line B, the substrates without a peak has the normal distribution approximated to the straight line A, and these distributions can be distinguished from each other, with the intermediate region at the boundary therebetween. Also, as shown in FIG. 8, it can be seen that the average of the values of carrier mobility from which plotted points begin to deviate from the approximated straight line A (i.e., the normal distribution of the substrates without a peak) is approximately 13 cm²/(V·s).

Therefore, the probability of the peak of the mobility curve occurring can be reduced by setting the carrier mobility of the TFT elements to be lower than or equal to 13 cm²/(V·s).

Figure 9:
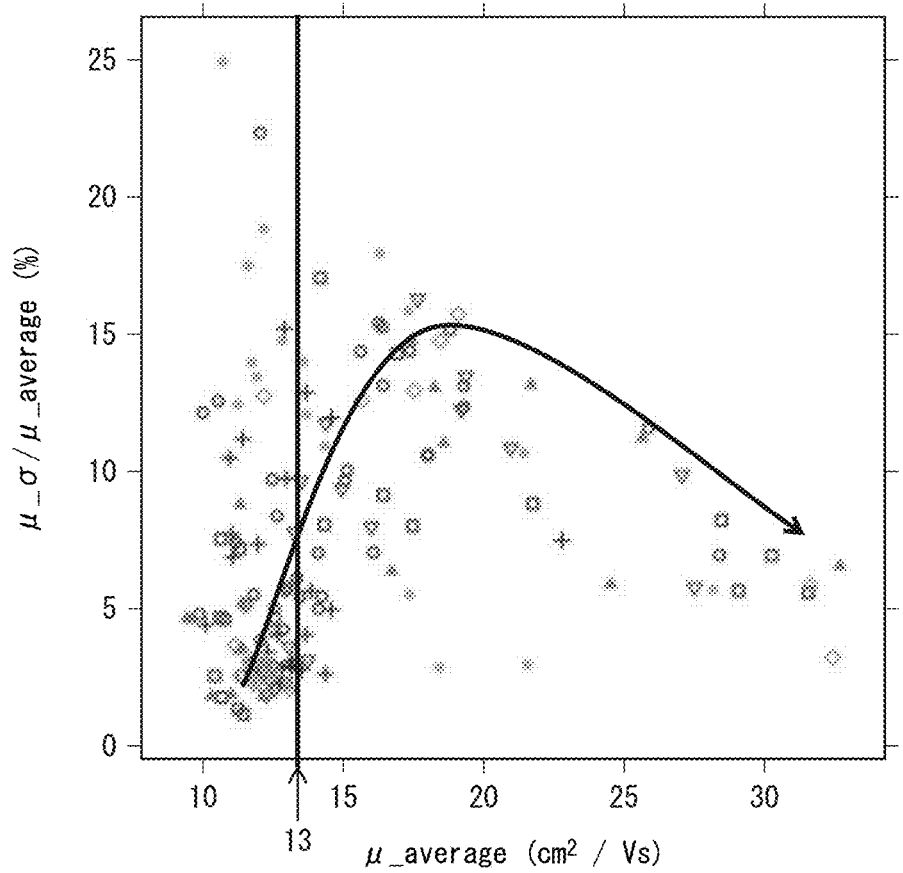
FIG. 9 is a diagram showing a correlation between average values and variations of the carrier mobility.

Next, FIG. 9 shows the results of a survey of the correlation between the average values and variations of the carrier mobility with respect to the plurality of lots of TFT substrates manufactured as described above. The horizontal axis indicates the average values of the carrier mobility in the TFT substrates, and the vertical axis indicates variations in the carrier mobility in the TFT substrates. FIG. 9 is a scatter diagram created by plotting corresponding points for each of a plurality of lots of TFT substrates.

For the vertical axis, a value obtained by dividing the standard deviation of the carrier mobility in the TFT substrates by the average value of the carrier mobility is used as the index of the variations. Here, as described above, the presence or absence of the peak of the mobility curve can be discerned based on the boundary at the average value of approximately 13 cm²/(V·s) (depicted as a straight line in FIG. 9) of the carrier mobility.

The arrow shown in FIG. 9 is an approximated curve indicating the distribution. As indicated by this arrow, the average values and the variations of the carrier mobility have a positive correlation within the range in which the average value of the carrier mobility is no higher than approximately 20 cm²/(V·s).

Therefore, variations in the carrier mobility among the TFT elements in the TFT substrates can be reduced by setting the carrier mobility of the TFT elements to be lower than or equal to 13 cm²/(V·s).

As described above, in the TFT element 101, it is possible to more reliably prevent the mobility curve from having a peak and reduce variations in the carrier mobility by setting the carrier mobility to be lower than or equal to 13 cm²/(V·s).

One specific method that can be conceived to set the carrier mobility of TFT elements to be lower than or equal to 13 cm²/(V·s) is, for example, to calculate the carrier mobility of TFT elements during the manufacturing process, and classify them based on 13 cm²/(V·s). In the case of this method, classification may be performed based on the maximum values of carrier mobility of the TFT elements in TFT substrates, or based on the average values of carrier mobility of the TFT elements in TFT substrates.

Embodiment 2

The following describes an organic EL display device 2 according to Embodiment 2 of the present invention. The present embodiment is an example in which the TFT element 101 according to Embodiment 1 is adopted in the organic EL display device 2.

1. Overall Configuration of Organic EL Display Device 2

Figure 10:
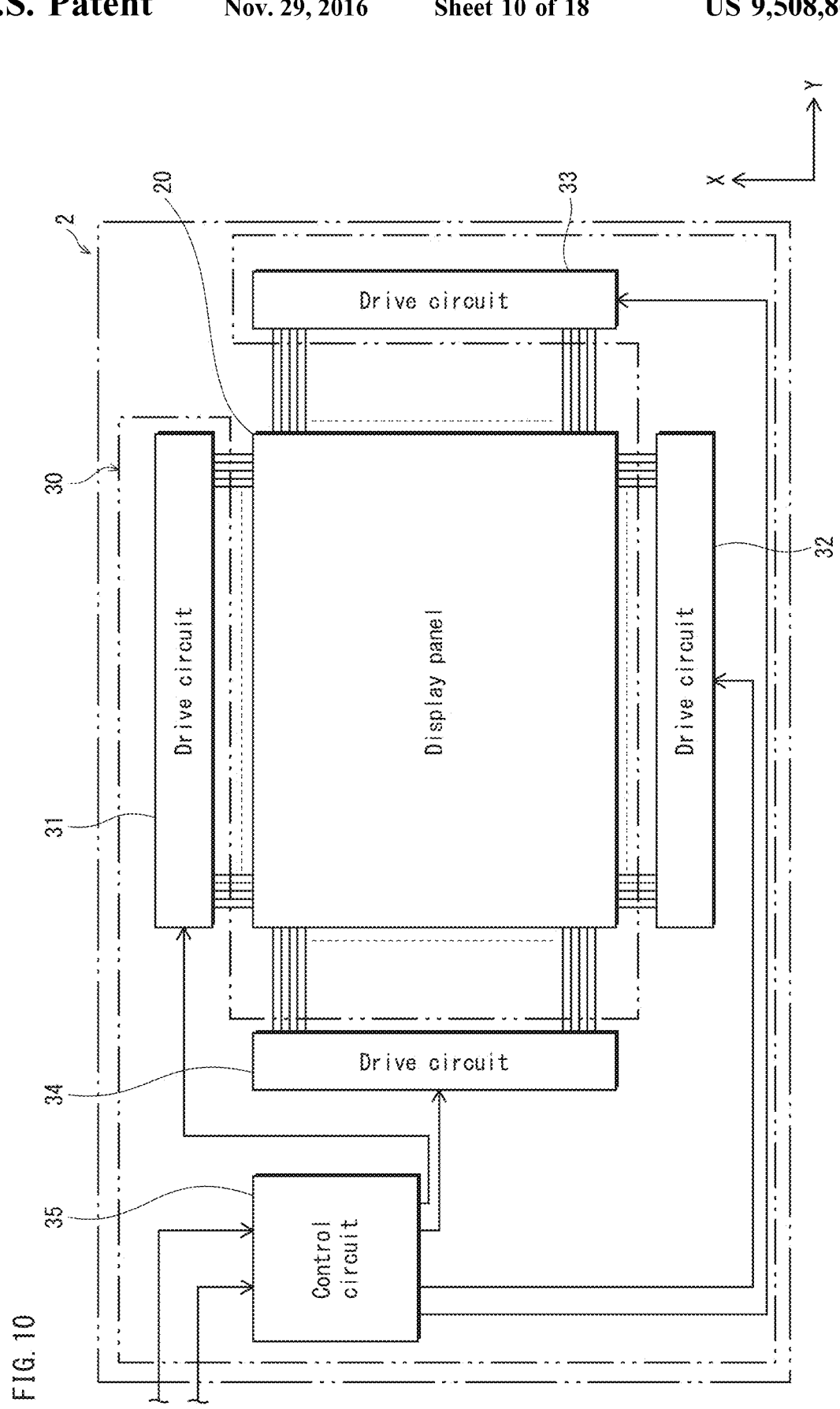
FIG. 10 is a schematic block diagram showing an overall configuration of an organic EL display device 2 according to Embodiment 2 of the present invention.

The following describes the configuration of the organic EL display device 2 according to the present embodiment with reference to FIG. 10.

As shown in FIG. 10, the organic EL display device 2 includes an organic EL display panel 20 and a drive control unit 30 connected therewith.

The organic EL display panel 20 is a panel utilizing the electric-field light-emitting phenomenon of organic material. The organic EL display panel 20 has a plurality of sub pixels 20a (not shown in FIG. 10) corresponding to luminescent colors such as red, green, and blue, and they are arranged in a matrix. The drive control unit 30 includes four drive circuits, namely drive circuits 31 to 34, and a control circuit 35. Note that in the organic EL display device 2, the arrangement of the drive control unit 30 relative to the organic EL display panel 20 is not limited to the above.

2. Configuration of Organic EL Display Panel 20

Figure 11:
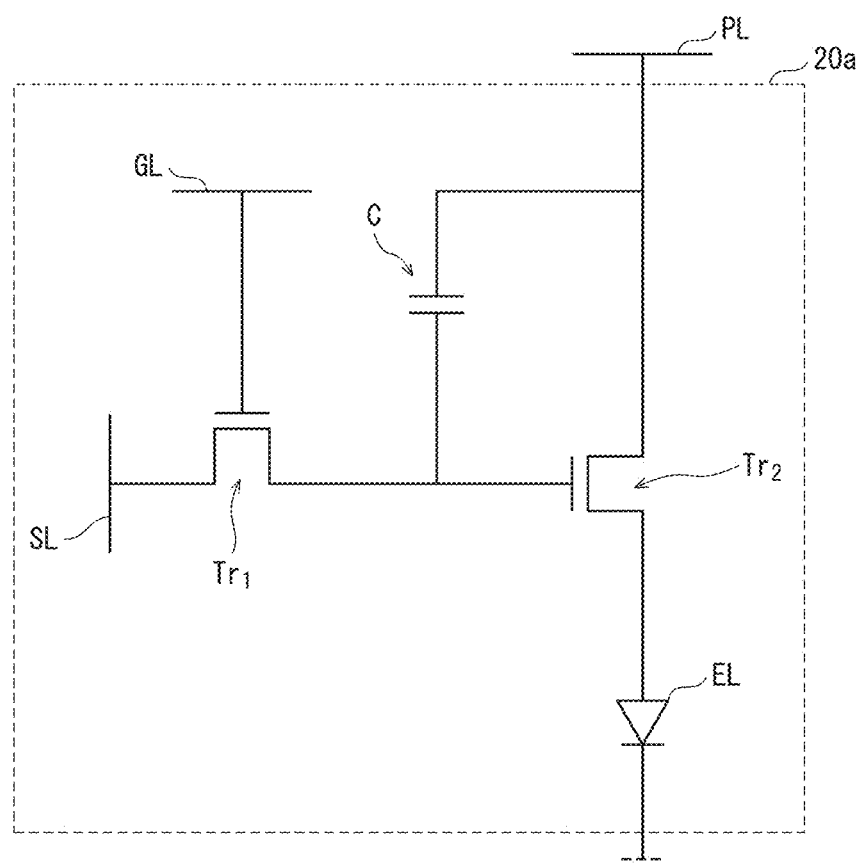
Figure 12:
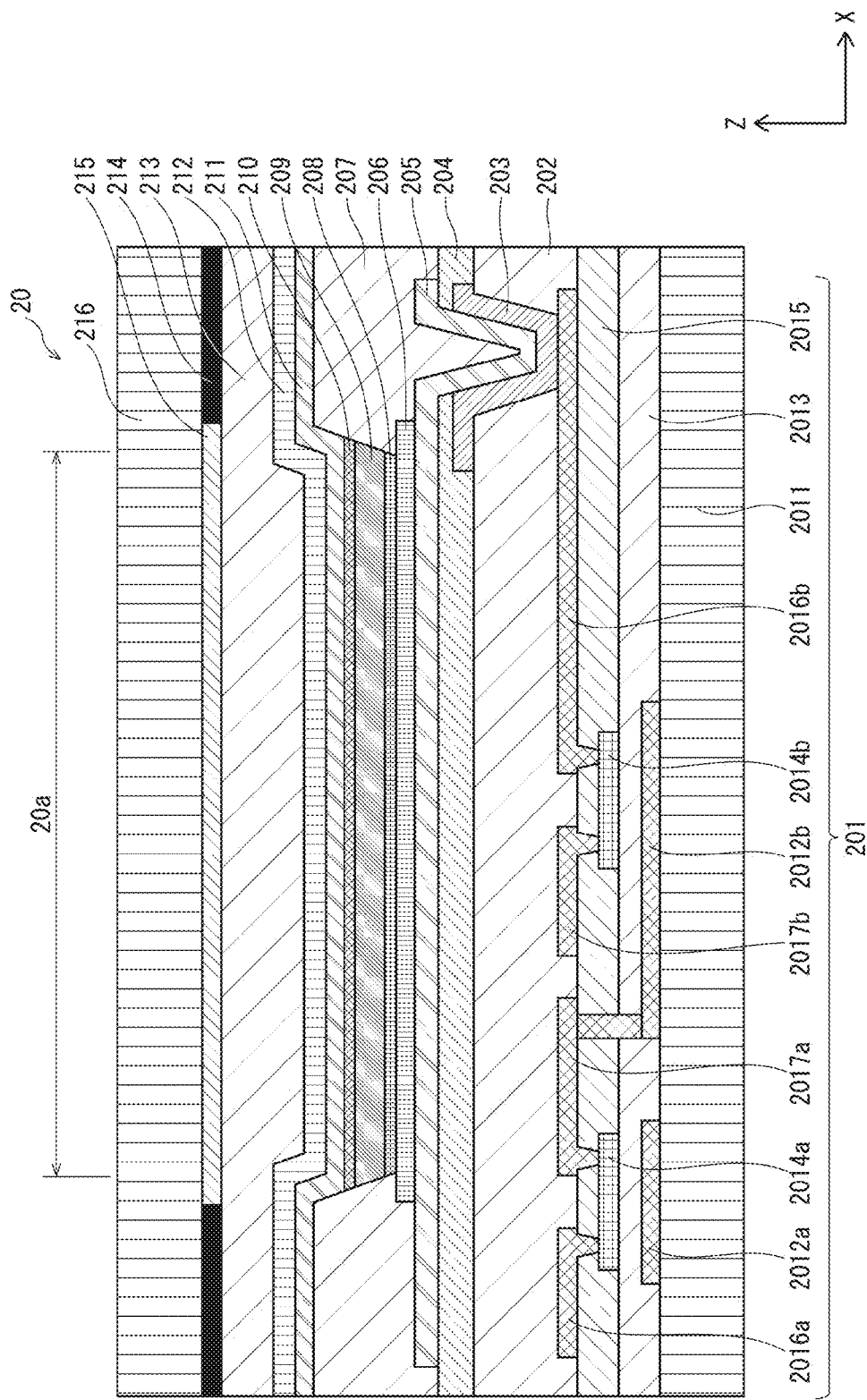
FIG. 12 is a schematic cross-sectional diagram showing a portion of the configuration of an organic EL display panel 20.

The following describes the configuration of the organic EL display panel 20 with reference to the circuit configuration diagram shown in FIG. 11 and the schematic cross-sectional diagram shown in FIG. 12. Note that FIG. 11 and FIG. 12 show the configuration of one of the sub pixels 20a.

(1) Circuit Configuration of Organic EL Display Panel 20

As shown in FIG. 11, the sub pixel 20a included in the organic EL display panel 20 includes an organic EL element EL, a switching transistor $Tr_1$, a driving transistor $Tr_2$, and a capacitor C. The switching transistor $Tr_1$ is connected with the driving transistor $Tr_2$, the capacitor C, a signal line SL, and a gate line GL. Note that the signal line SL and the gate line GL are connected with any of the drive circuits 31 to 34. The driving transistor $Tr_2$ is connected with the capacitor C, the switching transistor $Tr_1$, the organic EL element EL, and a power supply line PL. Note that the power supply line PL is connected with an external power supply, and supplies electric power to the organic EL element EL.

In this configuration, when the switching transistor $Tr_1$ is turned ON by a signal from the gate line GL, signal voltage supplied from the signal line SL is accumulated in the capacitor C, and is retained for a predetermined period of time. The retained signal voltage determines the conductance of the driving transistor $Tr_2$. The conductance of the driving transistor $Tr_2$ determines driving current supplied from the power supply line PL to the organic EL element EL. Therefore, the organic EL element EL emits light having a color tone that corresponds to the signal voltage for a predetermined period of time.

In the organic EL display panel 20, a set of light rays that are emitted by the sub pixels 20a under such color tone control is displayed as an image.

(2) Cross-Sectional Configuration of Organic EL Display Panel 20

The following describes a cross-sectional configuration of the organic EL display panel 20 with reference to FIG. 12.

As shown in FIG. 12, in the organic EL display panel 20, a TFT substrate 201 that includes a substrate 2011, a gate electrodes 2012a and 2012b, a gate insulation layer 2013, channel layers 2014a and 2014b, a channel protection layer 2015, source electrodes 2016a and 2016b, and drain electrodes 2017a and 2017b is formed.

In the TFT substrate 201, the gate electrode 2012a, the channel layer 2014a, the source electrode 2016a, and the drain electrode 2017a constitute the switching transistor $Tr_1$ shown in FIG. 11, and the gate electrode 2012b, the channel layer 2014b, the source electrode 2016b, and the drain electrode 2017b constitute the driving transistor $Tr_2$ shown in FIG. 11.

Here, the respective facing portions of the drain electrodes 2017a and 2017b have a length that is smaller than or equal to 2.5 μm in the channel length direction. That is, the switching transistor $Tr_1$ and the driving transistor $Tr_2$ in the TFT substrate 201 have the same configuration as the TFT element 101 in Embodiment 1.

Also, in the same manner as in the circuit configuration shown in FIG. 11, the drain electrode 2017a of the switching transistor $Tr_1$ is also formed in the contact hole provided in a portion of the gate insulation layer 2013 and a portion of the channel protection layer 2015 on/above the gate electrode 2012b of the driving transistor $Tr_2$, and is thus connected with the gate electrode 2012b.

Also, a passivation layer 202 is formed on the TFT substrate 201 so as to cover the source electrodes 2016a and 2016b and the drain electrodes 2017a and 2017b.

Also, an extraction electrode 203 is formed on the passivation layer 202. The extraction electrode 203 is also formed along the side surface of the contact hole provided in the passivation layer 202 on the source electrode 2016b, and is thus connected with the source electrode 2016b. Furthermore, a planarizing layer 204 is formed to cover a portion of the extraction electrode 203.

Also, an anode 205 is formed on the planarizing layer 204. The anode 205 is also formed along the side surface of the contact hole provided in a portion of the planarizing layer 204 on the extraction electrode 203, and is thus connected with the extraction electrode 203. Furthermore, a hole injection layer 206 is formed on the main surface of the anode 205.

Also, a bank 207 is formed on the planarizing layer 204, the anode 205, and the hole injection layer 206 so as to surround the region that corresponds to the light-emitting part (the sub pixel 20a). Furthermore, a hole transporting layer 208, an organic light-emitting layer 209, and an electron transport layer 210 are formed in this order in an aperture that is surrounded by the bank 207 on the hole injection layer 206. Also, a cathode 211 and a sealing layer 212 are formed in this order on the bank 207 and the electron transport layer 210.

In addition, a substrate 216 having a light-shielding layer 214 and a color filter 215 on the lower surface thereof is disposed above the sealing layer 212. The sealing layer 212 and the substrate 216 are attached to each other by a sealing resin layer 213. The color filter 215 is disposed to include the region that corresponds to the sub pixel 20a. Furthermore, the light-shielding layer 214 is disposed around the color filter 215.

3. Constituent Material of Organic EL Display Panel 20

In the organic EL display panel 20, each of the constituent elements may be formed with the following materials, for example. Note that the constituent elements of the TFT substrate 201 can be formed with the same materials as the constituent elements of the TFT element 101 according to Embodiment 1, and therefore a description thereof is omitted.

(1) Passivation Layer 202

In the passivation layer 202, a material that adheres tightly to the source electrodes 2016a and 2016b and to the drain electrodes 2017a and 2017b and has barrier properties against hydrogen, moisture, and the like can be used. For example, a single layer structure of a silicon oxide film, a silicon nitride film, a silicon oxynitride film, or an aluminum oxide film, or a multilayer structure with layers of the aforementioned films can be used.

(2) Extraction Electrode 203

In the extraction electrode 203, the same material as the material used for forming the gate electrodes 2012a and 2012b can be used, for example.

(3) Planarizing Layer 204

In the planarizing layer 204, an organic compound such as polyimide, polyamide, or an acrylic resin material can be used, for example.

(4) Anode 205

In the anode 205, a metal material including silver or aluminum can be used, for example. Note that in the case of a top-emission type panel like the organic EL display panel 20, it is preferable that the surface part thereof is highly reflective.

(5) Hole Injection Layer 206

In the hole injection layer 206, an oxide of sliver, molybdenum, chromium, vanadium, tungsten, nickel, or iridium, or a conductive polymer material such as PEDOT (a mixture of polythiophene and polystyrene sulfonate) can be used, for example.

(6) Bank 207

In the bank 207, an organic material such as electrically insulative resin can be used, for example. Specific examples include an acrylic resin, polyimide resin, and novolac-type phenolic resin. Note that the bank 207 is preferably formed from a material that is resistant to an organic solvent and is unlikely to change excessively in shape or quality during an etching process or a baking process. Also, to provide the surface thereof with liquid repellency, the surface can be fluoridated. Furthermore, a multilayer structure with films in which the aforementioned materials are used may be adopted.

(7) Hole Transporting Layer 208

The hole transporting layer 208 is formed by using a polymer not containing a hydrophilic group. For example, a polymer such as polyfluorene or a derivative thereof, or polyarylamine or a derivative thereof that does not contain a hydrophilic group can be used.

(8) Organic Light-Emitting Layer 209

In the organic light-emitting layer 209, a light-emitting organic material that can be formed into a film by a wet printing method is used. Specifically, fluorescent materials such as compounds, derivatives, complexes, or the like disclosed in Japanese Patent Application Publication No. 5-163488 can be used, for example.

(9) Electron Transport Layer 210

In the electron transport layer 210, an oxadiazole derivative (OXD), a triazole derivative (TAZ), a phenanthroline derivative (BCP), or the like can be used, for example.

(10) Cathode 211

In the case of a top-emission type panel like the organic EL display panel 20, the cathode 211 needs to be formed with a light-transmissive material. For example, ITO, indium zinc oxide (IZO), or the like can be used. Alternatively, a film that includes an alkali metal, an alkali earth metal, or a halide of the aforementioned sorts of metal, or a multilayer structure in which the aforementioned films and a film that includes silver are layered one after another can be used. Also, in order to improve light extraction efficiency, a highly transparent refraction index adjustment layer may be provided above the layer that includes silver.

(11) Sealing Layer 212

In the sealing layer 212, a material that has barrier properties against moisture, air, and the like is used. Also, in the case of the organic EL display panel 20 that is of the top-emission type, a light-transmitting material needs to be used. For example, a silicon nitride film or a silicon oxynitride film is used.

(12) Sealing Resin Layer 213

In the sealing resin layer 213, a material that has barrier properties against moisture and oxygen and that has adhesivity for attaching the sealing layer 212 to the color filter 215 and the light-shielding layer 214 is used. For example, a resin material such as epoxy resin, acrylic resin, or silicone resin is used.

4. Method for Manufacturing Organic EL Display Panel 20

The following describes the outline of the method for manufacturing the organic EL display panel 20, using the reference signs shown in FIG. 12.

First, the TFT substrate 201 is formed. The method for forming the TFT substrate 201 is the same as the method for forming the TFT element 101 according to Embodiment 1.

Here, in the organic EL display panel 20, the drain electrode 2017a of the switching transistor $Tr_1$ is connected with the gate electrode 2012b of the driving transistor $Tr_2$.

Such a configuration can be realized in the following manner, for example. First, in the step of providing a contact hole in the channel protection layer 2015, a portion of the gate insulation layer 2013 and a portion of the channel protection layer 2015 on/above the gate electrode 2012b are also etched as shown in FIG. 12, and thus the contact hole is provided. Then, in the step of forming the drain electrode 2017a, the drain electrode 2017a is formed in the contact hole as well, and is thus connected with the gate electrode 2012b.

Next, the passivation layer 202 is formed on the TFT substrate 201 so as to cover the source electrodes 2016a and 2016b and the drain electrodes 2017a and 2017b. Also, a contact hole is provided in a portion of the passivation layer 202 on the source electrode 2016b. The passivation layer 202 can be formed by, for example, forming an insulative film by a plasma CVD method, a sputtering method, or the like, and providing a contact hole therein by a photolithography method and an etching method.

Next, the extraction electrode 203 is formed on the passivation layer 202. The extraction electrode 203 is formed along the side wall of the contact hole provided in the passivation layer 202, and is thus connected with the source electrode 2016b. The extraction electrode 203 can be formed by, for example, patterning a metal film formed by a sputtering method or the like.

Next, the planarizing layer 204 that is made of insulative material is formed on the passivation layer 202 and the extraction electrode 203. Also, a contact hole is provided in a portion of the planarizing layer 204 on the extraction electrode 203. Furthermore, the upper surface of the planarizing layer 204 in the Z axis direction, except for the portion corresponding to the contact hole, is substantially planarized.

Next, the anode 205 that defines the corresponding sub pixel 20a is formed on the planarizing layer 204. The anode 205 is also formed along the side wall of the contact hole provided in the planarizing layer 204, and is thus connected with the extraction electrode 203. The anode 205 can be formed by, for example, forming a metal film by a sputtering method, a vacuum deposition method, or the like, and etching the metal film so as to define the corresponding sub pixel 20a.

Next, the hole injection layer 206 is formed on the anode 205. The hole injection layer 206 is formed so as to define the corresponding sub pixel 20a. The hole injection layer 206 can be formed by, for example, a sputtering method using an argon gas and an oxygen gas.

Next, the bank 207 is formed on the planarizing layer 204, the anode 205, and the hole injection layer 206. The bank 207 can be formed by, for example, first forming a layer of a material that includes a photosensitive resin component and a fluorine component on the planarizing layer 204, the anode 205, and the hole injection layer 206 by a spin coat method or the like, and then patterning an aperture for the corresponding sub pixel 20a as shown in FIG. 12.

Next, the hole transporting layer 208, the organic light-emitting layer 209, and the electron transport layer 210 are sequentially formed to be stacked on the hole injection layer 206. The hole transporting layer 208 can be formed by, for example, forming a film made of an organic compound by a printing method, and thereafter baking the film. The organic light-emitting layer 209 and the electron transport layer 210 can be formed in the same manner.

Next, the cathode 211 and the sealing layer 212 are sequentially formed to be stacked on the electron transport layer 210. As shown in FIG. 12, the cathode 211 and the sealing layer 212 are formed on the entire surface so as to cover the exposed portions of the bank 207.

Next, the sealing resin layer 213 is formed by applying an adhesive resin material on the sealing layer 212, and a prepared color filter panel that includes the color filter 215, the light-shielding layer 214, and the substrate 216 is attached thereto. As shown in FIG. 12, in the color filter panel, the color filter 215 is disposed at the position that is on the lower surface of the substrate 216 in the Z axis direction and that corresponds to the sub pixel 20a, and the light-shielding layer 214 is disposed around the color filter 215.

The organic EL display panel 20 is completed in the above-described manner. After that, the organic EL display device 2 is formed by attaching the drive control unit 30 to the organic EL display panel 20 (see FIG. 10), and application of aging processing completes the organic EL display device 2. The aging processing is performed by, for example, supplying power until the mobility of holes becomes lower than or equal to $1/10$ relative to the hole injection properties before the processing. Specifically, power supply processing is performed for a predetermined period of time so that a luminance that is higher than or equal to the luminance during practical use and that is three or more times the luminance during practical use is achieved.

5. Achievable Advantageous Effects

The switching transistor $Tr_1$ and the driving transistor $Tr_2$ in the TFT substrate 201 provided in the organic EL display device 2 have the same configuration as the TFT element 101 according to Embodiment 1. That is, the respective facing portions of the drain electrodes 2017a and 2017b have a length that is smaller than or equal to 2.5 μm in the channel length direction.

Therefore, the switching transistor $Tr_1$ and the driving transistor $Tr_2$ of the TFT substrate 201 can suppress the peak of the mobility curve despite the use of oxide semiconductor in the channel layers 2014a and 2014b. Therefore, the organic EL display device 2 provided with such a TFT substrate can suppress degradation in the display quality and the reliability, while having the high performance electrical properties of the oxide semiconductor.

Note that in the TFT substrate 201, as in Embodiment 1, it is preferable that the length of the above-described facing portions in the channel length direction is greater than or equal to 2.0 μm. This configuration can suppress a decrease in the yield rate of the TFT substrate 201 due to misalignment of the photomask, diffraction at the time of exposure, or the like, which leads to suppressing a decrease in the yield rate of the organic EL display device 2 as a whole.

In the TFT substrate 201, it is also preferable that the average value of the carrier mobility in each TFT element is lower than or equal to 13 $cm^2/(V \cdot s)$. This configuration can more reliably prevent the mobility curve of each TFT element provided in the TFT substrate 201 from having a peak, and reduce variations in the carrier mobility among the TFT elements. Therefore, it is possible to more reliably reduce degradation in the image quality and the reliability of the organic EL display device 2.

Embodiment 3

The following describes a TFT element 301 according to Embodiment 3 as an aspect of the present invention. Note that, of the TFT element 301, the same parts as in the TFT element 101 are labelled using the same reference signs, and a description thereof is omitted.

1. Configuration

Figure 13:
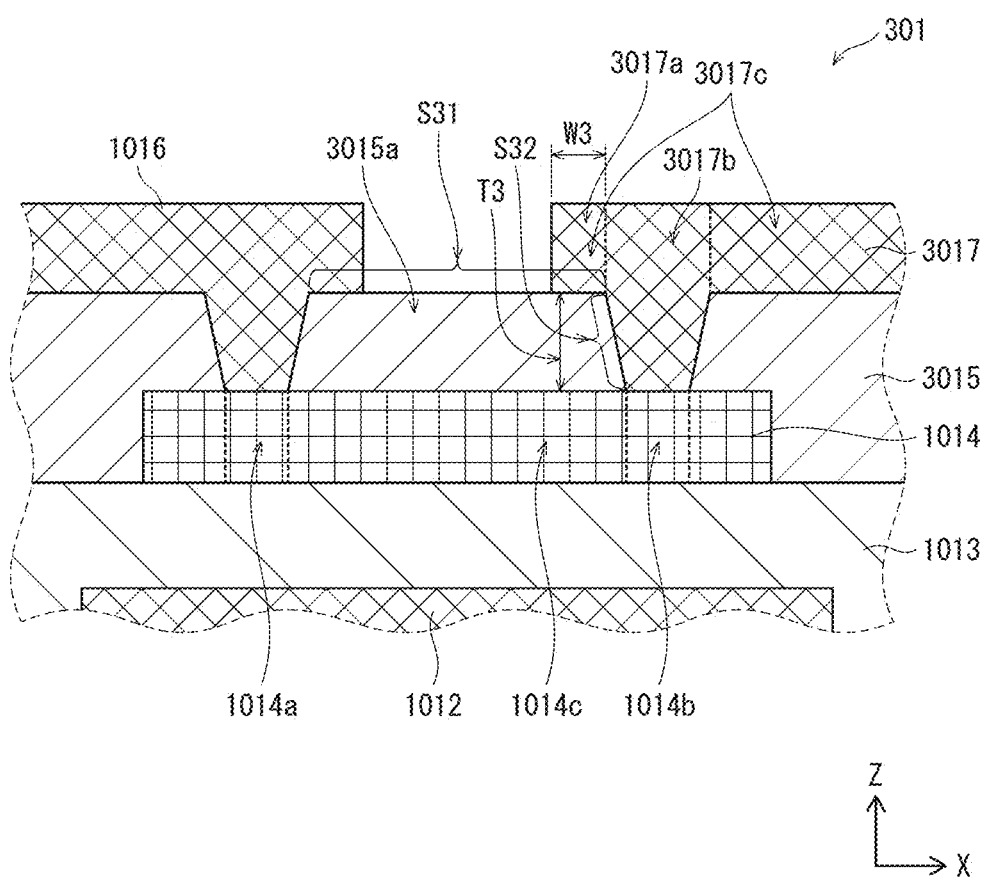
FIG. 13 is a schematic cross-sectional diagram that magnifies a portion of a TFT element 301 according to Embodiment 3 of the present invention.

FIG. 13 is a schematic cross-sectional diagram that magnifies a portion of the TFT element 301, and that corresponds to FIG. 2 for the TFT element 101. Like the TFT element 101, the TFT element 301 is a TFT element of the inverted-staggered type and of the channel protection type. The TFT element 301 includes channel protection layer 3015 and a drain electrode 3017 as elements different from the TFT element 101.

The channel protection layer 3015 covers the channel layer 1014 except for the source contact region 1014a and the drain contact region 1014b so that the source contact region 1014a and the drain contact region 1014b are exposed. Consequently, the surface of the channel protection layer 3015 includes an upper surface S31, and a side surface S32 that extends from the upper surface S31 to the source contact region 1014a and to the drain contact region 1014b.

Also, the drain electrode 3017 has a rising portion 3017b that extends from above the drain contact region 1014b along the side surface S32 that is continuous therewith, and an upper surface covering portion 3017c that is continuous with the rising portion 3017b and extends onto a portion of the upper surface S31. Also, the upper surface covering portion 3017c includes a facing portion 3017a that faces the channel region 1014c.

Here, in the TFT element 301, W3 and T3 fulfil a predetermined condition, where W3 (μm) denotes the length of the facing portion 3017a in the channel length direction, and T3 (nm) denotes the shortest distance between the channel layer 1014 and the facing portion 3017a.

2. Condition Fulfilled by W3 and T3

Figure 14:
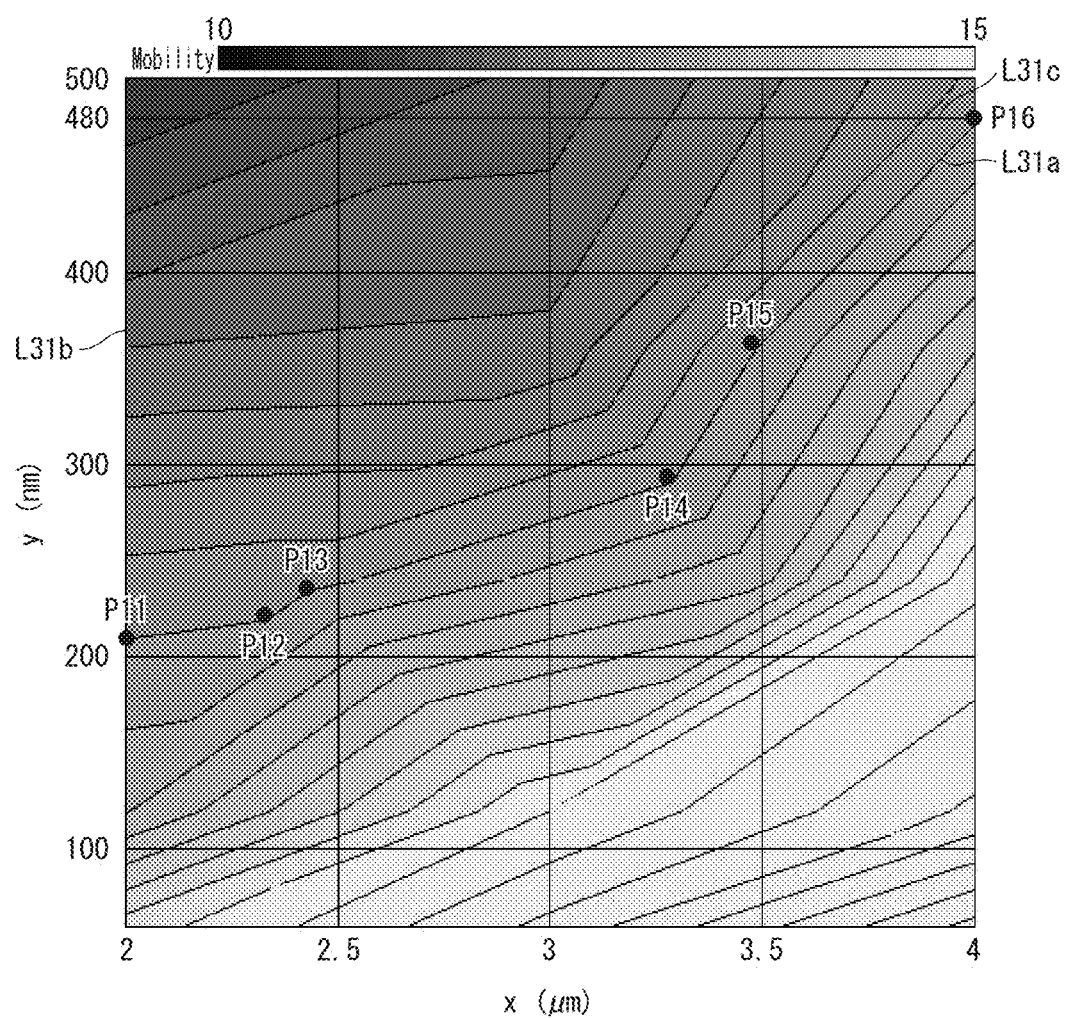
FIG. 14 is a diagram showing a correlation among the length of a facing portion in the channel length direction, the shortest distance between the channel layer and the facing portion, and the carrier mobility, when $V_d$ is 4.1 V.

FIG. 14 is a diagram showing a correlation among the length of the facing portion in the channel length direction, the shortest distance between the channel layer and the facing portion, and the carrier mobility, when $V_d$ is 4.1 V. In FIG. 14, the horizontal axis indicates the length x (μm) of the facing portion 3017a in the channel length direction, and the vertical axis indicates the shortest distance y (nm) between the channel layer 1014 and the facing portion 3017a. Also, in FIG. 14, with respect to each combination of x and y, the degree of the carrier mobility in the channel region 1014c obtained by a simulation is represented with shading, where a darker color indicates a lower carrier mobility, and a lighter color indicates a higher carrier mobility. The carrier mobility increases in the direction from the top left to the bottom right. This is because the electric field effect of the facing portion 3017a on the channel region 1014c increases as x increases and y decreases.

FIG. 14 also shows contour lines of the carrier mobility, which are lines each connecting combinations of x and y at which the carrier mobility has the same value. In particular, a line L31a that connects points P11 to P16 in FIG. 14 is a contour line at which the carrier mobility is 13 cm$^2$/(V·s). Here, when each point in FIG. 14 is expressed with coordinates (x, y), the points P11 to P16 are specifically expressed as follows.

$P11=(2.00,209)$ $P12=(2.33,219)$ $P13=(2.43,234)$ $P14=(3.29,291)$ $P15=(3.49,360)$ $P16=(4.00,480)$

In the case of the TFT element 301, in the xy coordinate system shown in FIG. 14, a point (W3, T3) is located within the range surrounded by the line L31a that connects points (2.00, 209), (2.33, 219), (2.43, 234), (3.29, 291), (3.49, 360), and (4.00, 480), a straight line L31b that connects points (2.00, 209) and (2.00, 480), and a straight line L31c that connects points (2.00, 480) and (4.00, 480). Note that "within the range" mentioned above includes the cases where the point (W3, T3) is located on the line L31a, the straight line L31b, or the straight line L31c. In the following, the aforementioned range is referred to as the range C in order to facilitate the explanation thereof.

Note that W3 can be adjusted by appropriately setting the photo mask pattern when forming the drain electrode 3017, for example. Also, T3 can be adjusted by varying the film thickness of the channel protection layer 3015, for example.

3. Achievable Advantageous Effects

The line L31a is a contour line at which the carrier mobility is 13 cm$^2$/(V·s). In FIG. 14, the range C is located on the left side or the upper side of the line L31a. Therefore, since the point (W3, T3) is within the range C, the maximum value of the carrier mobility of the channel region 1014c of the TFT element 301 is 13 cm$^2$/(V·s).

In this case, as shown in FIG. 8, the TFT element 301 belongs to the distribution with which the mobility curve does not have a peak (the aforementioned straight line A). Therefore, in the TFT element 301, since the point (W3, T3) is within the range C, the peak of the mobility curve can be suppressed despite the use of oxide semiconductor in the channel layer.

More specifically, the reason why the TFT element 301 can suppress the peak of the mobility curve is that the electric field effect of the facing portion 3017a on the channel region 1014c generated depending on the magnitude of W3 is reduced to a level that is no greater than a predetermined level by adjusting the magnitude of T3. Here, the level that is no greater than a predetermined level specifically is a level at which the carrier mobility of the channel region 1014c in the case where the mobility curve does not have a peak according to the statistical data (FIG. 8) is lower than or equal to 13 cm$^2$/(V·s).

In the TFT element 301, even in the case where W3 is greater than or equal to 2.5 µm and the facing portion 3017a has a significant electric field effect, it is possible to suppress the peak of the mobility curve by increasing T3 to be greater than or equal to a predetermined value and reducing the electric field effect on the channel region 1014c to a level that is no greater than a predetermined level. In fact, the condition fulfilled by W3 and T3 of TFT element 301 (the range C) includes the range in which W3 is greater than or equal to 2.5 µm as shown in FIG. 14.

In contrast, the TFT element 101 can suppress the peak of the mobility curve because the electric field effect of the facing portion 3017a can be reduced to a negligible level by reducing W1 to be smaller than or equal to 2.5 µm. In other words, the TFT element 101 can suppress the peak of the mobility curve regardless of the value of the shortest distance between the channel region 1014c and the facing portion 1017a (e.g., the film thickness of the channel protection layer 1015). In the case of the TFT element 101, the carrier mobility of the channel region 1014c is higher than 13 cm$^2$/(V·s) in some cases, and even in these cases, the peak of the mobility curve is suppressed.

As described above, the TFT element 101 and the TFT element 301 are similar in that the peak of mobility curve is suppressed by reducing the electric field effect of the facing portions 1017a and 3017a on the channel region 1014c. However, the TFT element 101 and the TFT element 301 are different in the specific method for suppressing the peak of the mobility curve. That is, the TFT element 101 absolutely reduces the sheer electric field effect of the facing portion 1017a by reducing W1 to be no greater than a predetermined value, whereas the TFT element 301 relatively reduces the electric field effect of the facing portion 3017a by setting W3 and T3 to fall within a predetermined range.

4. Others

In the range C, the straight line L31b is a straight line that expresses x=2.0 µm. Therefore, since the point (W3, T3) is within the range C, the minimum value of W3 is 2.0 µm. Consequently, in the TFT element 301, it is possible to leave a margin for avoiding abnormal formation (e.g., over-etching) of the drain electrode 3017 due to misalignment of the photomask, diffraction at the time of exposure, or the like. Therefore, the TFT element 301 having such a configuration can avoid a decrease in the yield rate.

Also, in the range C, the straight line L31c is a straight line that expresses y=480 nm. Therefore, since the point (W3, T3) is within the range C, the maximum value of T3 is 480 nm. Consequently, the TFT element 301 can prevent a break from occurring in the source electrode 1016, the drain electrode 3017, and so on. This is because when T3 is greater than or equal to 480 nm, the level difference between the upper surface of the channel layer 1014 and the upper surface S31 of the channel protection layer 3015 is too large, and as a result there is the possibility of disconnection occurring in the source electrode 1016, the drain electrode 3017, and so on.

Figure 15:
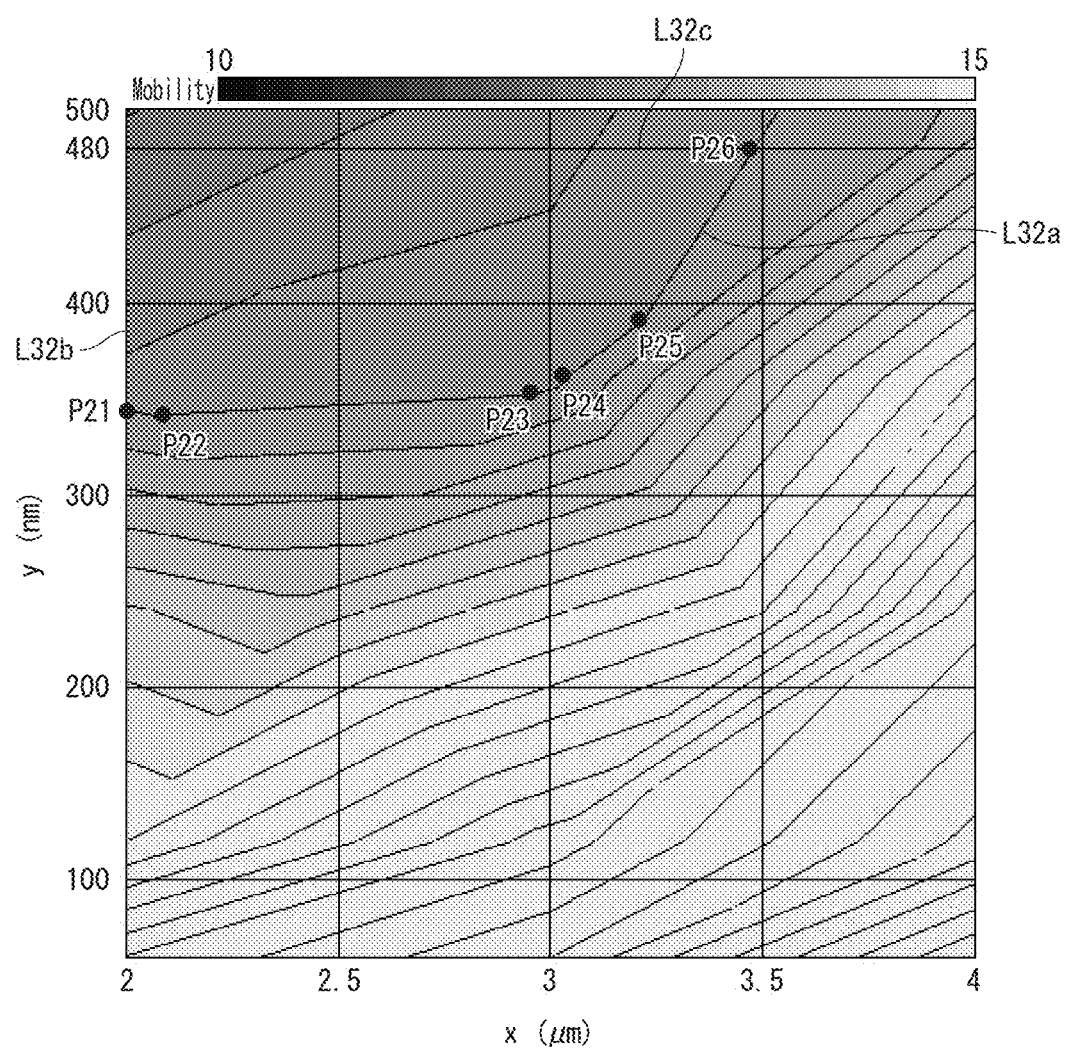
FIG. 15 is a diagram showing a correlation among the length of the facing portion in the channel length direction, the shortest distance between the channel layer and the facing portion, and the carrier mobility, when $V_d$ is 10 V.

Also, in the case of the TFT element 301, in the xy coordinate system shown in FIG. 15, it is further preferable that the point (W3, T3) is located within the range surrounded by a line L32a that connects points (2.00, 344), (2.06, 341), (2.97, 352), (3.02, 356), (3.22, 390), and (3.48, 480), a straight line L32b that connects points (2.00, 344) and (2.00, 480), and a straight line L32c that connects points (2.00, 480) and (3.48, 480). Note that "within the range" mentioned above includes the cases where the point (W3, T3) is located on the line L32a, the straight line L32b, or the straight line L32c. In the following, the aforementioned range is referred to as the range D in order to facilitate the explanation thereof. The following describes advantageous effects in the case where W3 and T3 fulfil the aforementioned condition with reference to FIG. 15.

FIG. 15 is a diagram showing a correlation among the length of the facing portion in the channel length direction, the shortest distance between the channel layer and the facing portion, and the carrier mobility, when $V_d$, is 10 V. FIG. 14 shows the carrier mobility of the channel region 1014c in the case of a drain voltage that is usually used for TFT elements ($V_d$=4.1 V). Therefore, since the point (W3, T3) is within the range C shown in FIG. 14, it is possible to suppress the peak of the mobility curve of the TFT element 301 in an average usage mode under average conditions.

In contrast, using the same vertical and horizontal axes as FIG. 14, FIG. 15 shows the carrier mobility of the channel region 1014c in the case of a drain voltage that is sufficiently large for TFT elements ($V_d$=10 V). Specifically, the line L32a that connects points P21 to P26 in FIG. 15 is a contour line at which the carrier mobility is 13 cm$^2$/(V·s) when $V_d$ is 10 V. When each point in FIG. 15 is expressed with coordinates (x, y), the points P21 to P26 are specifically expressed as follows.

$P21=(2.00,344)$ $P22=(2.06,341)$ $P23=(2.97,352)$ $P24=(3.02,356)$ $P25=(3.22,390)$ $P26=(3.48,480)$

That is, since the point (W3, T3) is located within the range D, the maximum value of the carrier mobility of the channel region 1014c of the TFT element 301 is 13 cm$^2$/(V·s) even in the case of a sufficiently large drain voltage ($V_d$=10 V). Here, the electric field effect of the facing portion 3017a on the channel region 1014c increases as the drain voltage increases. Therefore, in this case, the mobility of the channel region 1014c of the TFT element 301 is smaller than or equal to 13 cm$^2$/(V·s) even under a more severe condition. Therefore, in this case, the TFT element 301 can further suppress the electric field effect on the channel region, and sufficiently suppress the peak of the mobility curve.

Also, in the range D, the straight line L32b and the straight line L31c are, as with the straight line L31b and the straight line L32c in the range C, straight lines that express x=2.0 μm and y=480 nm, respectively. Therefore, the TFT element 301 with the point (W3, T3) within the range D can suppress a decrease in the yield rate, and prevent a break from occurring in the source electrode 1016, the drain electrode 3017, and so on.

<Other Considerations>

The present invention is in no way limited to the above-described embodiments except in its essential characteristic constituent elements. For example, the scope of the present invention includes any modifications to the above-described embodiments that can be conceived of by a person skilled in the art, and any combinations of the constituent elements and functions of the above-described embodiments that do not depart from the spirit of the present invention.

In Embodiment 1 above, the facing portion 1017a of the TFT element 101 is a portion of the upper surface covering portion 1017c on the upper surface S11, and does not include a portion that faces the channel region out of the rising portion immediately above the side surface S12. However, depending on the TFT element, there are cases where it is difficult to distinguish between the portions corresponding to the upper surface S11 and the side surface S12. In such cases, among the surfaces of the channel protection layer, surfaces other than the surface that is in contact with the channel layer may be regarded as upper surfaces, and the facing portion of the drain electrode may be "a portion of the drain electrode that is stacked on the channel protection layer and that faces the channel region". The shape of the channel protection layer can be observed under a transmission electron microscope, for example.

In Embodiment 1 above, regarding the source electrode 1016 and the drain electrode 1017 of the TFT element 101, one with the reference electrical potential relative to the gate voltage is determined to be the source electrode 1016, and the other is determined to be the drain electrode 1017. This is not an absolute distinction, and the way of distinguishing is determined according to the conditions of the configuration of the apparatus that uses the TFT element 101. Therefore, in the TFT element, any electrode, even if referred to as a source electrode, has an electric field effect on the channel region at any instant, the electrode at the instant can be regarded as the drain electrode according to Embodiment 1. Therefore, setting the length in the channel length direction of the portion of the electrode that corresponds to the facing portion to be smaller than or equal to 2.5 μm is also included in Embodiment 1.

In Embodiments 1 and 2 above, the source electrode and the drain electrode are in contact with the channel layer via the contact hole provided in the channel protection layer. However, the present invention is not limited to this configuration, and any configuration may be adopted insofar as the drain electrode has the facing portion. For example, the channel protection layer may be formed only on the channel region, and the respective end portions of the source electrode and the drain electrode that are on the opposite side to the channel region may be formed directly on the channel layer, the gate insulation layer, or the like.

In Embodiment 2 above, the same configuration as the TFT element 101 according to Embodiment 1 above is used in both the switching transistor $Tr_1$ and the driving transistor $Tr_2$. However, the present invention is not limited to this configuration, and it is acceptable that only one of the transistors has the same configuration as TFT element 101.

In Embodiment 2 above, as shown in FIG. 11, a configuration is adopted in which two transistor elements are provided for each sub pixel. However, the number of transistor elements provided for each sub pixel can be appropriately changed as needed. For example, one transistor element may be provided for each sub pixel, or, conversely, three or more transistor elements may be provided for each sub pixel.

In Embodiment 2 above, the sub pixels are arranged in a matrix. However, the present invention is not limited to this configuration. For example, it is possible to adopt a configuration in which sub pixels that emit red, green, and blue light are arranged at the vertices of a triangle. Also, the luminescent colors of the sub pixels are not limited to the three colors, namely red, green, and blue, and a configuration using other colors may be adopted. For example, it is possible to use the color white alone, or four colors, namely red, green, blue, and yellow.

The constituent materials described in Embodiments 1 and 2 above are merely examples, and may be changed as needed. For example, it is possible to use a flexible material in the substrate and construct a deformable display device. Also, oxide semiconductor used in the channel layer is not limited to that in the amorphous state, and polycrystalline InGaO or the like may be used, for example.

In Embodiment 2 above, as shown in FIG. 12, the organic EL display panel 20 is configured of the top-emission type. However, the bottom-emission type may be adopted. If this is the case, each constituent elements can be changed as needed.

In Embodiment 2 above, an organic EL display device is taken as an example of a display device. However, the present invention is not limited to an organic EL display device, and may be applied to a liquid display device using a liquid display panel, a field emission display device using a field emission display panel, and the like. Also, the present invention is applicable to electronic paper.

Also, the above-described modifications related to Embodiment 1 are applicable to the TFT element 301 according to Embodiment 3. Furthermore, one or both of the switching transistor $Tr_1$ and the driving transistor $Tr_2$ in Embodiment 2 may have the same configuration as the TFT element 301.

INDUSTRIAL APPLICABILITY

The TFT elements and the organic EL display devices according to the present invention is applicable broadly to display devices such as television sets, personal computers, mobile telephones, and other various electronic devices having a TFT element or a display device.

REFERENCE SIGNS LIST 2 organic EL display device
101, 301, 901 TFT element
1012, 2012a, 2012b, 9012 gate electrode
1014, 2014a, 2014b, 5024, 9014 channel layer
1014a, 9014a source contact region
1014b, 9014b drain contact region
1014c, 9014c channel region
1015, 2015, 3015, 9015 channel protection layer
1016, 2016a, 2016b, 5026, 9016 source electrode
1017, 2017a, 2017b, 3017, 5027, 9017 drain electrode
1017a, 3017a, 9017a facing portion
1017b, 3017b, 9017b rising portion
1017c, 3017c, 9017c upper surface covering portion

The invention claimed is:
1. A thin-film transistor comprising:
a gate electrode;
a channel layer disposed above the gate electrode and not adjacent to the gate electrode;
a channel protection layer covering a portion of the channel layer and exposing a portion of the channel layer;
a source electrode that is in contact with the channel layer at a source contact region that is a portion of an exposed portion of the channel layer; and
a drain electrode that is not adjacent to the source electrode and is in contact with the channel layer at a drain contact region that is a portion of the exposed portion, the drain contact portion being different from the source contact region, wherein
the channel layer includes oxide semiconductor,
a surface of the channel protection layer includes an upper surface and a side surface that extends from the upper surface to the exposed portion,
the drain electrode has:
a rising portion that extends from above the drain contact region to the channel layer along the side surface of the channel protection layer; and
an upper surface covering portion that is continuous with the rising portion and extends onto a portion of the upper surface of the channel protection layer,
the upper surface covering portion has a facing portion that faces a channel region that is a region of the channel layer interposed between the source contact region and the drain contact region, and
the facing portion has a length that is smaller than or equal to 2.5 μm in a channel length direction in which a straight line that connects the source contact region with the drain contact region along a shortest distance therebetween extends.

2. The thin-film transistor according to claim 1, wherein the facing portion has a length that is no smaller than 2.0 μm in the channel length direction.

3. The thin-film transistor according to claim 1, wherein a carrier mobility in the channel region of the thin-film transistor is lower than or equal to 13 cm$^2$/(V·s).

4. A display device comprising a plurality of thin-film transistors according to claim 1.

5. The display device according to claim 4, wherein an average value of a carrier mobility in the respective channel regions of the plurality of thin-film transistors is lower than or equal to 13 cm$^2$/(V·s).

6. A method for manufacturing a thin-film transistor, comprising:
forming a gate electrode;
forming a channel layer above the gate electrode so as not to be adjacent to the gate electrode;
forming a channel protection layer so as to cover a portion of the channel layer and expose a portion of the channel layer;
forming a source electrode so as to be in contact with the channel layer at a source contact region that is a portion of an exposed portion of the channel layer; and
forming a drain electrode so as not to be adjacent to the source electrode and be in contact with the channel layer at a drain contact region that is a portion of the exposed portion, the drain contact portion being different from the source contact region, wherein
in forming the channel layer, oxide semiconductor is used for forming the channel layer,
in forming the channel protection layer, an upper surface and a side surface that extends from the upper surface to the exposed portion are formed as a surface of the channel protection layer,
in forming the drain electrode, the drain electrode is formed so as to have a rising portion and an upper surface covering portion, the rising portion extending from above the drain contact region to the channel layer along the side surface of the channel protection layer, the upper surface covering portion being continuous with the rising portion, extending onto a portion of the upper surface of the channel protection layer, and having a facing portion that faces a channel region that is a region of the channel layer interposed between the source contact region and the drain contact region, the facing portion having a length that is smaller than or equal to 2.5 μm in a channel length direction in which a straight line that connects the source contact region with the drain contact region along a shortest distance therebetween extends.

7. The method for manufacturing a thin-film transistor according to claim 6, wherein
when the drain electrode is formed, the facing portion is formed so as to have a length that is no smaller than 2.0 μm in the channel length direction.

8. A thin-film transistor comprising:
a gate electrode;
a channel layer disposed above the gate electrode and not adjacent to the gate electrode;
a channel protection layer covering a portion of the channel layer and exposing a portion of the channel layer;
a source electrode that is in contact with the channel layer at a source contact region that is a portion of an exposed portion of the channel layer; and
a drain electrode that is not adjacent to the source electrode and is in contact with the channel layer at a drain contact region that is a portion of the exposed portion, the drain contact portion being different from the source contact region, wherein
the channel layer includes oxide semiconductor,
a surface of the channel protection layer includes an upper surface and a side surface that extends from the upper surface to the exposed portion,
the drain electrode has:
   a rising portion that extends from above the drain contact region to the channel layer along the side surface of the channel protection layer; and
   an upper surface covering portion that is continuous with the rising portion and extends onto a portion of the upper surface of the channel protection layer,
the upper surface covering portion has a facing portion that faces a channel region that is a region of the channel layer interposed between the source contact region and the drain contact region,
the facing portion has a length that is smaller than or equal to 2.5 µm in a channel length direction in which a straight line that connects the source contact region with the drain contact region along a shortest distance therebetween extends, and
in an xy coordinate system in which points are expressed with coordinates (x, y), a point (W3, T3) is located within a range that is surrounded by a line that connects points (2.00, 209), (2.33, 219), (2.43, 234), (3.29, 291), (3.49, 360), and (4.00, 480), a straight line that connects points (2.00, 209) and (2.00, 480), and a straight line that connects points (2.00, 480) and (4.00, 480), where W3 (µm) denotes a length of the facing portion in a channel length direction in which a straight line that connects the source contact region with the drain contact region along a shortest distance therebetween extends, and T3 (nm) denotes a shortest distance between the channel layer and the facing portion.

9. The thin-film transistor according to claim 8, wherein in the xy coordinate system, the point (W3, T3) is located within a range that is surrounded by a line that connects points (2.00, 344), (2.06, 341), (2.97, 352), (3.02, 356), (3.22, 390), and (3.48, 480), a straight line that connects points (2.00, 344) and (2.00, 480), and a straight line that connects points (2.00, 480) and (3.48, 480).

10. A display device comprising a plurality of thin-film transistors according to claim 8.

* * * * *